(12) United States Patent
Aono et al.

(10) Patent No.: US 7,986,003 B2
(45) Date of Patent: Jul. 26, 2011

(54) SEMICONDUCTOR DEVICE AND MANUFACTURING METHOD THEREOF

(75) Inventors: Shinji Aono, Chiyoda-ku (JP); Hideki Takahashi, Chiyoda-ku (JP); Yoshifumi Tomomatsu, Chiyoda-ku (JP); Junichi Moritani, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 708 days.

(21) Appl. No.: 11/828,616

(22) Filed: Jul. 26, 2007

(65) Prior Publication Data
US 2008/0197379 A1 Aug. 21, 2008

(30) Foreign Application Priority Data
Feb. 16, 2007 (JP) .................................. 2007-036512

(51) Int. Cl.
*H01L 29/739* (2006.01)
(52) U.S. Cl. ........ 257/330; 257/327; 257/328; 257/329; 257/331; 257/334; 257/E21.382; 257/E21.383; 257/E21.384; 257/E21.385; 257/E29.197; 257/E29.198; 257/E29.2; 257/E29.201; 438/197; 438/268; 438/270
(58) Field of Classification Search .................. 257/133, 257/E21.388, E29.211, 327–331, 334, E21.382, 257/E21.383, E21.384, E21.385, E29.197, 257/E29.198, E29.2, E29.201; 438/138, 438/197, 268, 270
See application file for complete search history.

(56) References Cited

U.S. PATENT DOCUMENTS

| | | | |
|---|---|---|---|
| 5,751,024 A | 5/1998 | Takahashi | |
| 6,001,678 A | 12/1999 | Takahashi | |
| 6,040,599 A | 3/2000 | Takahashi | |
| 6,221,721 B1 * | 4/2001 | Takahashi | 438/270 |
| 6,768,168 B1 | 7/2004 | Takahashi | |
| 2002/0179976 A1 | 12/2002 | Takahashi | |
| 2003/0141542 A1 | 7/2003 | Ishimura et al. | |
| 2003/0148559 A1 * | 8/2003 | Onishi et al. | 438/138 |
| 2005/0017290 A1 * | 1/2005 | Takahashi et al. | 257/328 |
| 2005/0045960 A1 | 3/2005 | Takahashi | |
| 2005/0263853 A1 | 12/2005 | Tomomatsu et al. | |

FOREIGN PATENT DOCUMENTS

| | | |
|---|---|---|
| CN | 1591902 A | 3/2005 |
| CN | 1705136 A | 12/2005 |
| DE | 101 61 129 A1 | 12/2002 |
| DE | 10 2004 035 788 A1 | 3/2005 |
| DE | 10 2005 014 714 A1 | 12/2005 |
| JP | 8-316479 | 11/1996 |

(Continued)

*Primary Examiner* — Lynne A Gurley
*Assistant Examiner* — Naima J Kearney
(74) *Attorney, Agent, or Firm* — Oblon, Spivak, McClelland, Maier & Neustadt, L.L.P.

(57) ABSTRACT

A carrier storage layer is located in a region of a predetermined depth from a surface of an N– substrate, a base region is located in a shallower region than the predetermined depth and an emitter region is located in a surface of the N– substrate. The carrier storage layer is formed by phosphorus injected to have a maximum impurity concentration at the predetermined depth, the base region is formed by boron injected to have the maximum impurity concentration at a shallower position than the predetermined depth and the emitter region is formed by arsenic injected to have the maximum impurity concentration at the surface of the N– substrate. An opening is formed to extend through the emitter region, base region and the carrier storage layer. On the inner wall of the opening, a gate electrode is formed with a gate insulating film therebetween.

9 Claims, 38 Drawing Sheets

FOREIGN PATENT DOCUMENTS

| | | |
|---|---|---|
| JP | 9-121052 | 5/1997 |
| JP | 2002-353456 | 12/2002 |
| JP | 2003-224278 | 8/2003 |
| JP | 2004-63479 | 2/2004 |
| JP | 2005-56912 | 3/2005 |
| JP | 2006-229181 | 8/2006 |
| KR | 10-0199271 | 3/1999 |
| KR | 2002-0090837 | 12/2002 |
| KR | 10-2006-0045940 | 5/2006 |

* cited by examiner

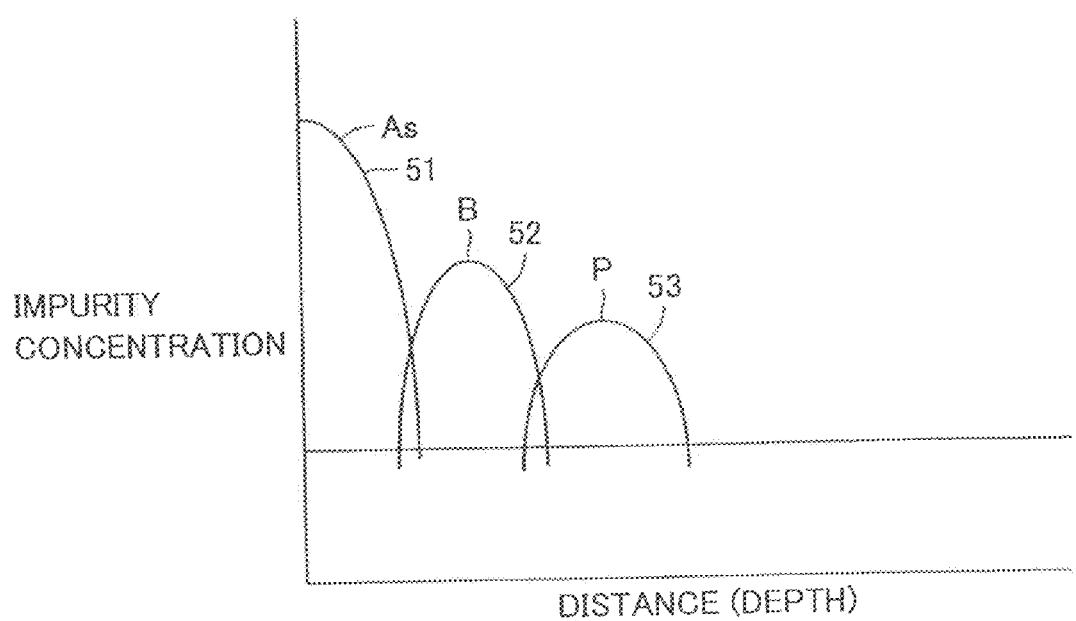

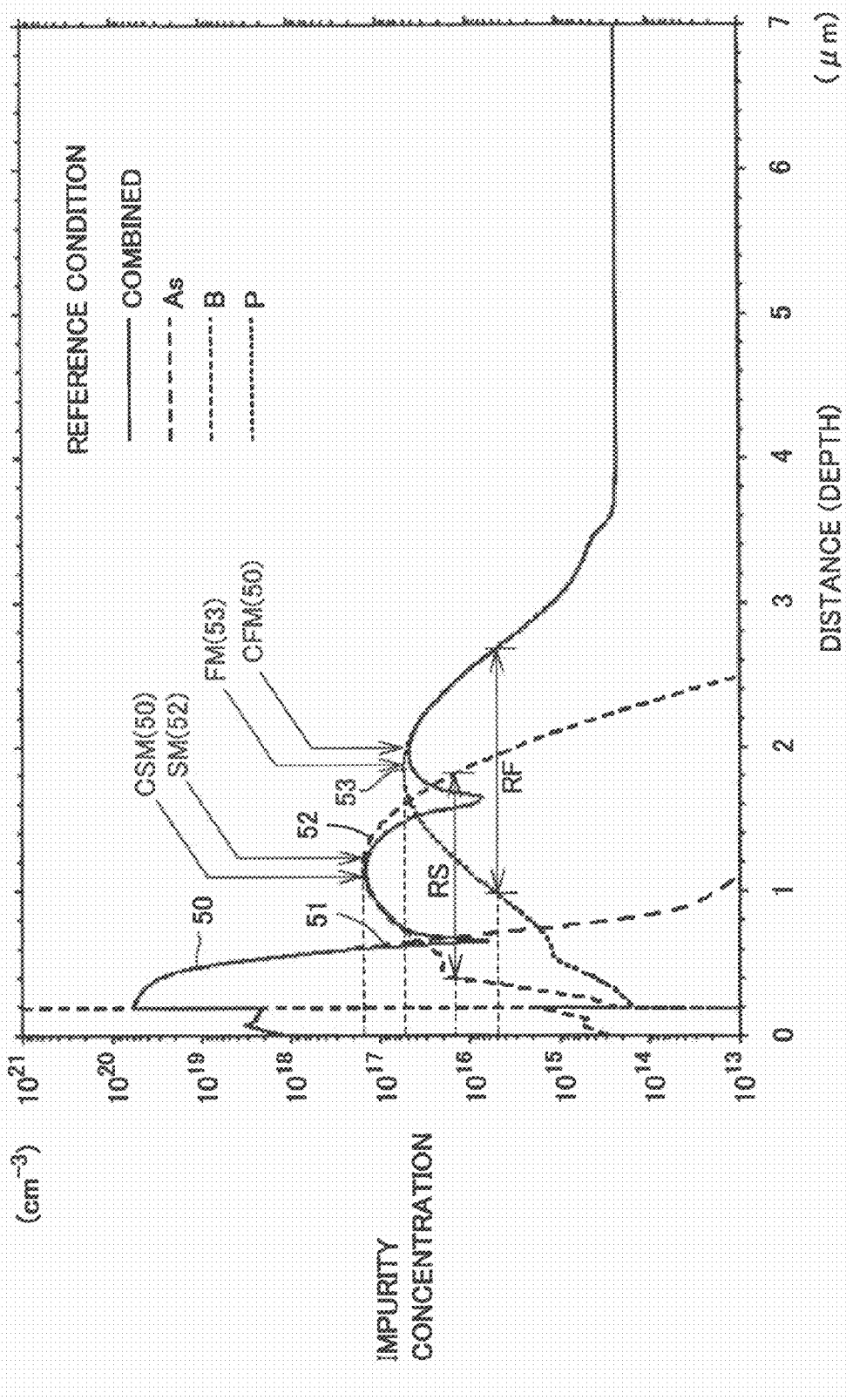

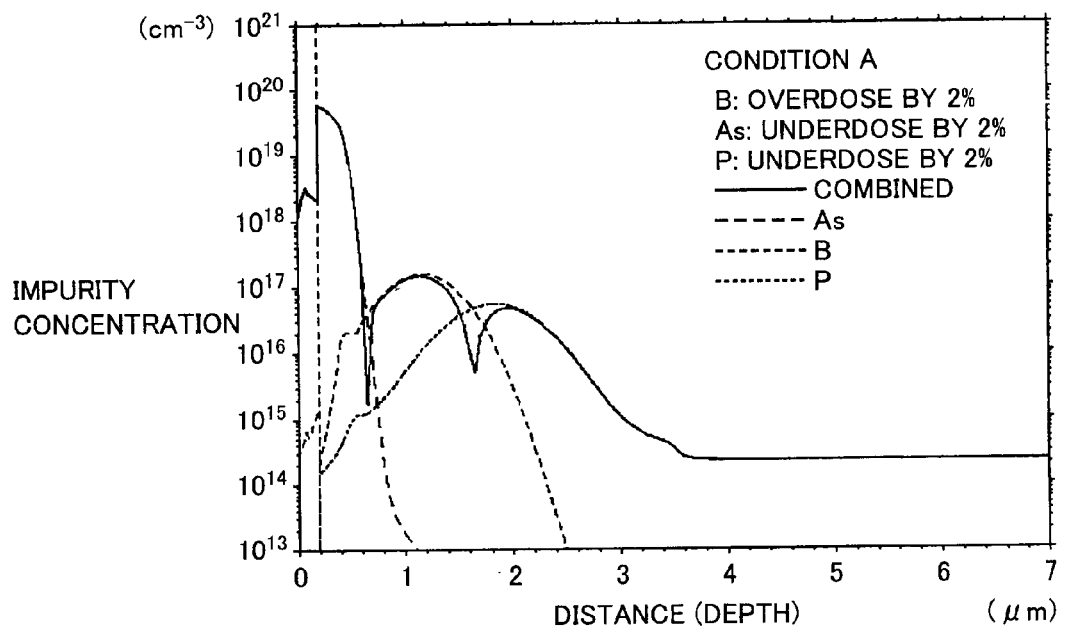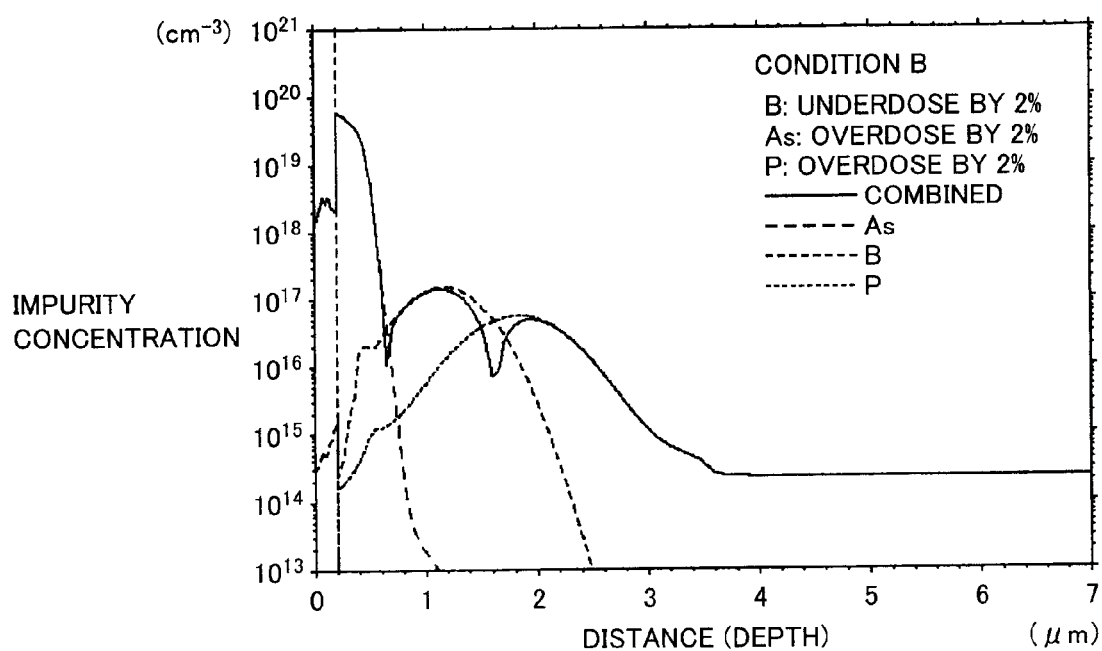

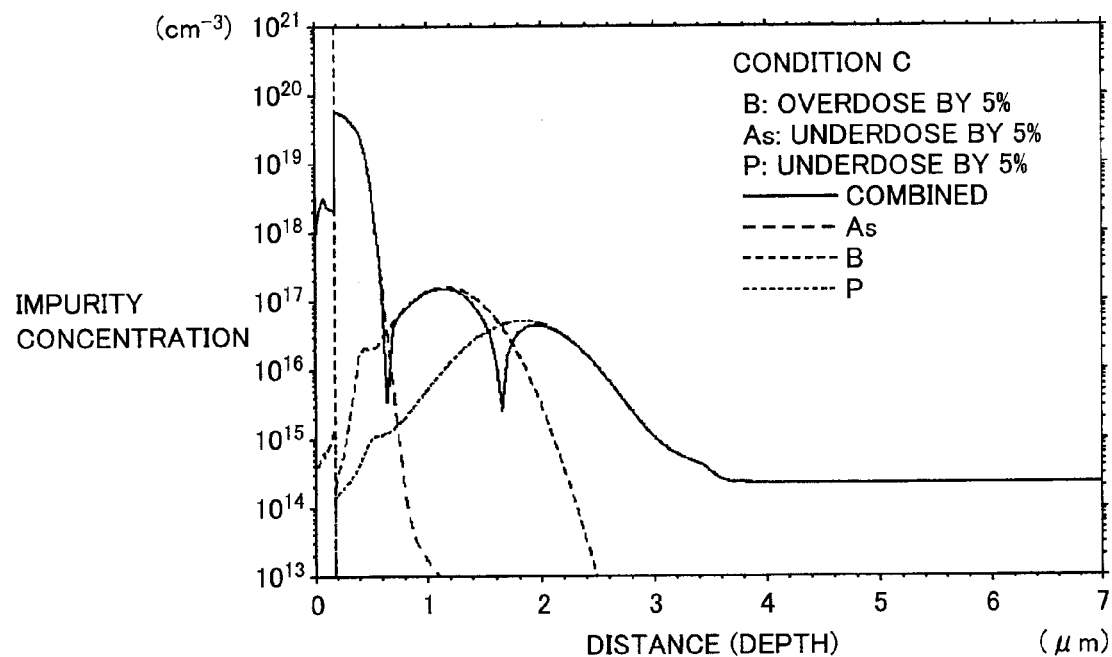
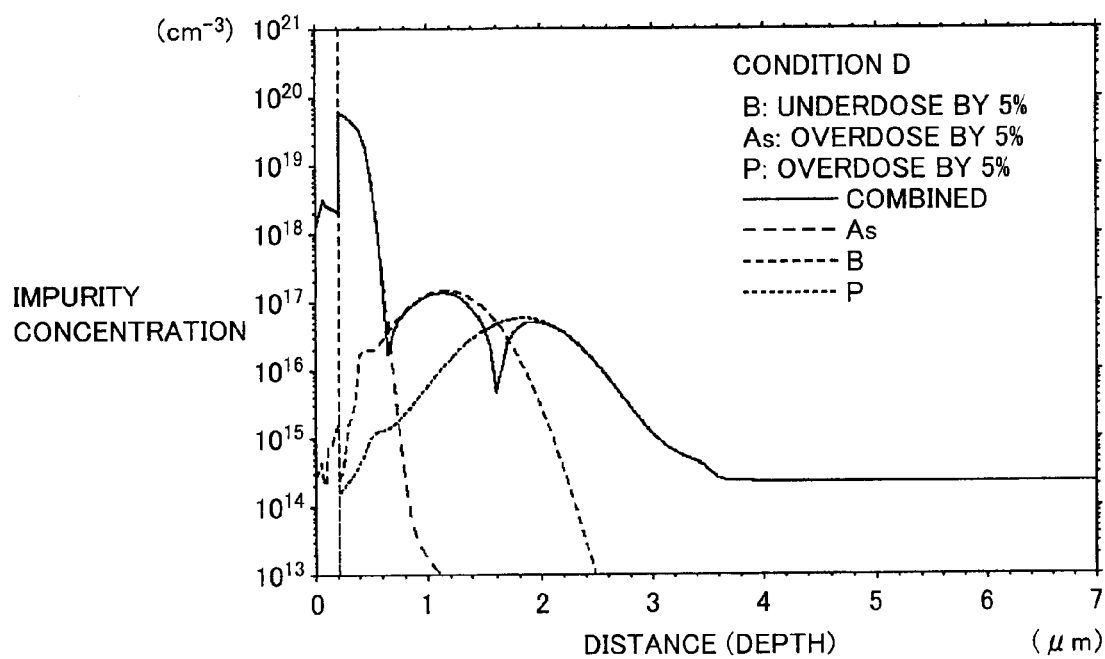

SEMICONDUCTOR DEVICE AND MANUFACTURING METHOD THEREOF

BACKGROUND OF THE INVENTION

1. Field of the Invention

The present invention relates to a semiconductor device and a method of manufacturing the semiconductor device. In particular, the invention relates to a semiconductor device having an insulated gate transistor and a method of manufacturing the semiconductor device.

2. Description of the Background Art

Recently, in the fields of household electrical appliances and industrial power units for example, inverter devices have become employed. For an inverter device, usually a commercial power supply (AC power supply) is used. Therefore, the inverter device is configured to include a converter unit making a forward conversion of once converting an AC voltage from the AC power supply into a DC voltage, a smoothing circuit and an inverter unit making a reverse conversion of converting the DC voltage into an AC voltage. As a main power element of the inverter unit, an insulated gate bipolar transistor (hereinafter referred to as IGBT) capable of performing relatively high-speed switching operation is chiefly employed.

Regarding an inverter device used for electric-power control, the electric current rating of one IGBT chip is approximately a few tens to a few hundreds of amperes (A) and the voltage rating thereof is approximately a few hundreds to a few thousands of volts (V). In a circuit using an IGBT as a resistance load and successively changing the gate voltage, electric power that is the product of the electric current and voltage is generated in the form of heat within the IGBT. Therefore, the inverter device requires a large heat radiator, resulting in deterioration in electric-power conversion efficiency. Further, depending on the combination of an operating voltage and an operating current, the temperature of the IGBT itself increases, resulting in thermal breakage of the IGBT. As such, in the inverter device, a resistance load circuit using an IGBT as a resistance load is rarely used.

In most of inverter devices, the load is an electric induction machine (inductive load motor). Therefore, in the inverter device, an IGBT is usually operated as a switch to repeat the OFF state and the ON state so as to control the electric power energy. Regarding switching of the inverter circuit of the inductive load, the ON state is established after a turn-on process while the OFF state is established after a turn-off process. The turn-on process refers to transition of the IGBT from the OFF state to the ON state and the turn-off process refers to transition of the IGBT from the ON state to the OFF state.

The inductive load is connected to a point of an intermediate potential between an upper arm element and a lower arm element, and an electric current is flown to the inductive load in both of the positive and negative directions. Therefore, in order to allow the electric current flowing through the inductive load to return from the load-connected portion toward a high-potential power supply or to flow from the load-connected portion toward the ground, a freewheel diode is necessary for circulating the current in a closed circuit of the inductive load and the arm element. For an inverter device having a relatively small capacity, a field-effect transistor (MOSFET: Metal Oxide Semiconductor Field-Effect Transistor) is used in some cases.

A voltage to be applied to the gate electrode for turning on the IGBT is called ON voltage (Vce (sat)). A configuration for providing a lower ON voltage is disclosed, for example, in Japanese Patent Laying-Open Nos. 8-316479 and 2002-353456 disclosing a carrier storage type IGBT which is an improved version of the trench gate type IGBT. In the carrier storage type IGBT, an n-type carrier storage layer is formed on one surface of an N− substrate, and a p-type base region is formed on the carrier storage layer.

In a predetermined region of a surface of the base region, an emitter region is formed. In a region except for the emitter region of the surface of the base region, a p+ contact region is formed. Further, an emitter electrode electrically connected to the emitter region is formed. Through the emitter region, base region and carrier storage layer, an opening is formed to reach an n-type region of the N− substrate, and a gate electrode is formed on the inner wall surface of the opening with a gate insulating film interposed therebetween.

On the other surface of the substrate, an n-type buffer layer is formed, and a p-type collector layer is formed on the buffer layer. On a surface of the collector layer, a collector electrode electrically connected to the collector layer is formed. The conventional carrier storage type IGBT is configured in this way.

In this carrier storage type IGBT, a voltage of at least the threshold voltage (Vth) is applied as a gate voltage to the gate electrode to form an n-channel region that is located near the gate electrode in the p-type base region. Accordingly, electrons are injected from the emitter region through the n-channel region into the N− substrate.

It is supposed that, in the state where a voltage of at least the threshold voltage is applied to the gate electrode, a voltage (collector voltage) is applied to the collector. Under this condition, the collector voltage is applied at least to the extent that causes the pn junction of the buffer layer and the collector layer to be forward biased. Then, from the collector electrode, holes are injected into the N− substrate. In the N− substrate, conductivity modulation occurs to cause the resistance value of the N− substrate to suddenly decrease, and accordingly the electric current flows and the electrically conductive ON state is established.

Thus, in the carrier storage type IGBT, the carrier storage layer located immediately under the p-type base region stores holes and electrons. Therefore, as compared with the trench gate type IGBT without the carrier storage layer, the carrier storage type IGBT has the advantage that the N− substrate has a higher carrier density and accordingly a lower resistivity, and thus a lower ON voltage is achieved.

In recent years, with the purpose of providing a compact and lightweight inverter device, an IGBT has been proposed that is called reverse conducting IGBT or reverse conducting carrier storage type IGBT having a free-wheeling diode formed in the configuration of the IGBT or carrier storage type IGBT and having electrical conduction capability to substantially the same degree in both directions.

The conventional carrier storage type IGBT, however, has the following problem. The n-type emitter region, the p-type base region and the n-type carrier storage layer of the carrier storage type IGBT are each formed by injecting impurity ions of a predetermined conductivity type and thermally diffusing the injected impurities. In the conventional carrier storage type IGBT, respective impurity concentration profiles are each the Gaussian distribution where the maximum impurity concentration is located near the surface of the N− substrate due to limitations of the manufacturing apparatus (ion injection apparatus).

The final impurity concentration profile of the n-type emitter region, the p-type base region and the n-type carrier storage layer is a triple diffusion profile comprised of the three Gaussian-distribution impurity concentration profiles overlapping each other. The triple diffusion profile has a p-type impurity concentration profile or an n-type impurity concentration profile depending on the relative relation or subtraction between respective numbers of impurity atoms. Thus, the threshold voltage (Vth) of the IGBT is likely to vary, as described below.

For a carrier storage type IGBT used for an inverter device, the threshold voltage (Vth) is set to approximately 5 V. Therefore, the maximum concentration of the p-type impurity in a region where the channel is formed along the gate insulating film in the p-type base region is approximately $1\times10^{17}$ cm$^{-3}$ to $1\times10^{18}$ cm$^{-3}$. In a region corresponding to the p-type base region, for example, the acceptor impurity concentration is at least approximately $1\times10^{18}$ cm$^{-3}$ and the donor impurity concentration is approximately $5\times10^{17}$ cm$^{-3}$.

The impurity concentration (density) of the portion which is located in the p-type base region and in which the n-type channel is formed is determined by subtracting the number (density) of donor atoms from the number (density) of acceptor atoms (the number of acceptor atoms—the number of donor atoms). The acceptor may be for example boron (B) or aluminum (Al) in silicon (Si), and the donor may be for example phosphorous (P) or arsenic (As) in silicon (Si).

In the case where the accepter impurity concentration and the donor impurity concentration are each on the above-described order, the impurity concentration of the finally formed p-type impurity region is approximately $1\times10^{17}$ to $2\times10^{17}$ cm$^{-3}$. Therefore, the p-type base region has the number (density) of acceptor atoms and the number (density) of donor atoms that are each larger (higher) than the impurity concentration (density) of the p-type base region.

Therefore, in the process of injecting impurity ions acting as acceptors, if the amount of injected impurity ions varies, the impurity concentration of the finally formed p-type base region also varies. In the process of injecting impurity ions acting as donors, if the amount of injected impurity ions varies, the impurity concentration of the p-type base region also varies. In other words, the impurity concentration of the p-type base region is influenced by the variation of the amount of injected impurity ions acting as acceptors and the variation of the amount of injected impurity ions acting as donors.

The threshold voltage of the IGBT has a certain range with respect to the center of variation of the amount of injected impurities. Regarding the conventional IGBT, the standard deviation is large, resulting in variation of the threshold voltage. If the threshold voltage varies and the voltage value is lower than a predetermined voltage, the resultant problem is that the semiconductor device is broken in the load short-circuit operation mode.

SUMMARY OF THE INVENTION

The present invention has been made for solving the above-described problem. An object of the invention is to provide a semiconductor device having reduced variation of the threshold voltage, and another object thereof is to provide a method of manufacturing such a semiconductor device.

A semiconductor device according to the present invention includes a semiconductor substrate of a first conductivity type, an impurity region of the first conductivity type, a second impurity region of the second conductivity type, a third impurity region of the first conductivity type, an opening, an insulating film, an electrode portion and a region of the second conductivity type. The semiconductor substrate of the first conductivity type has a first main surface and a second main surface opposite to each other. The first impurity region of the first conductivity type is formed by a first impurity of the first conductivity type having a maximum impurity concentration at a first depth from the first main surface of the semiconductor substrate, and the first impurity region is formed in a region corresponding to the first depth and spaced from the first main surface. The second impurity region of the second conductivity type is formed by a second impurity of the second conductivity type having a maximum impurity concentration at a second depth shallower than the first depth from the first main surface of the semiconductor substrate, and the second impurity region is formed from a region corresponding to the second depth to reach the first impurity region. The third impurity region of the first conductivity type is formed by a third impurity of the first conductivity type having a maximum impurity concentration at the first main surface of the semiconductor substrate, and the third impurity region is formed from the first main surface to a predetermined depth and spaced from the first impurity region with the second impurity region therebetween. The opening extends through the third impurity region, the second impurity region and the first impurity region to reach a region of the first conductivity type of the semiconductor substrate.

The insulating film is formed on a sidewall of the opening to cover the third impurity region, the second impurity region and the first impurity region exposed on the sidewall. The electrode portion is formed in the opening to cover the insulating film. The region of the second conductivity type is formed at the second main surface of the semiconductor substrate.

A method of manufacturing a semiconductor device according to the present invention includes the following steps. A semiconductor substrate of a first conductivity type having a first main surface and a second main surface opposite to each other is prepared. A first impurity of the first conductivity type is injected from the first main surface to have a maximum impurity concentration at a first depth from the first main surface of the semiconductor substrate (first injection step). A second impurity of a second conductivity type is injected from the first main surface to have a maximum impurity concentration at a second depth shallower than the first depth from the first main surface (second injection step). A third impurity of the first conductivity type is injected from the first main surface to have a maximum impurity concentration at the first main surface (third injection step). A first impurity region of the first conductivity type is formed in a region corresponding to the first depth by thermal diffusion of the first impurity. A second impurity region of the second conductivity type extending from a region corresponding to the second depth to reach the first impurity region is formed by thermal diffusion of the second impurity. A third impurity region extending from the first main surface to a predetermined depth and spaced from the first impurity region with the second impurity region therebetween is formed by thermal diffusion of the third impurity. An opening extending through the third impurity region, the second impurity region and the first impurity region is formed to reach a substrate region of the first conductivity type of the semiconductor substrate. An insulating film is formed in the opening to cover respective surfaces exposed on an inner wall of the opening of the third impurity region, the second impurity region and the first impurity region respectively. An electrode portion is formed by filling the opening with an electrically conductive layer to cover the insulating film. A region of the second conductivity type is formed at the second main surface of the semiconductor substrate.

The semiconductor device according to the present invention has the first impurity region, the second impurity region and the third impurity region having respective impurity concentrations that are each maximum at a position (depth) corresponding to a region where the corresponding one of the first impurity region, the second impurity region and the third impurity region is to be formed. Therefore, variation of the threshold voltage applied to the electrode portion for forming a channel region in the second impurity region can be reduced to a remarkable degree.

The method of manufacturing the semiconductor device according to the present invention includes the first injection step of injecting the first impurity so that the first impurity has a maximum impurity concentration at a position where the first impurity region is to be formed, the second injection step of injecting the second impurity so that the second impurity has a maximum impurity concentration at a position where the second impurity region is to be formed, and the third injection step of injecting the third impurity so that the third impurity has a maximum impurity concentration at a position where the third impurity region is to be formed. In this way, variation of the threshold voltage applied to the electrode to form a channel region in the second impurity region can be reduced to a remarkable degree.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 schematically shows impurity concentration profiles along a line of cross section VI-VI shown in FIG. 1.

FIGS. 7 to 11 show respective impurity concentration profiles in respective simulations based on first to fifth conditions respectively, according to the first embodiment.

DESCRIPTION OF THE PREFERRED EMBODIMENTS

First Embodiment

Figure 1:
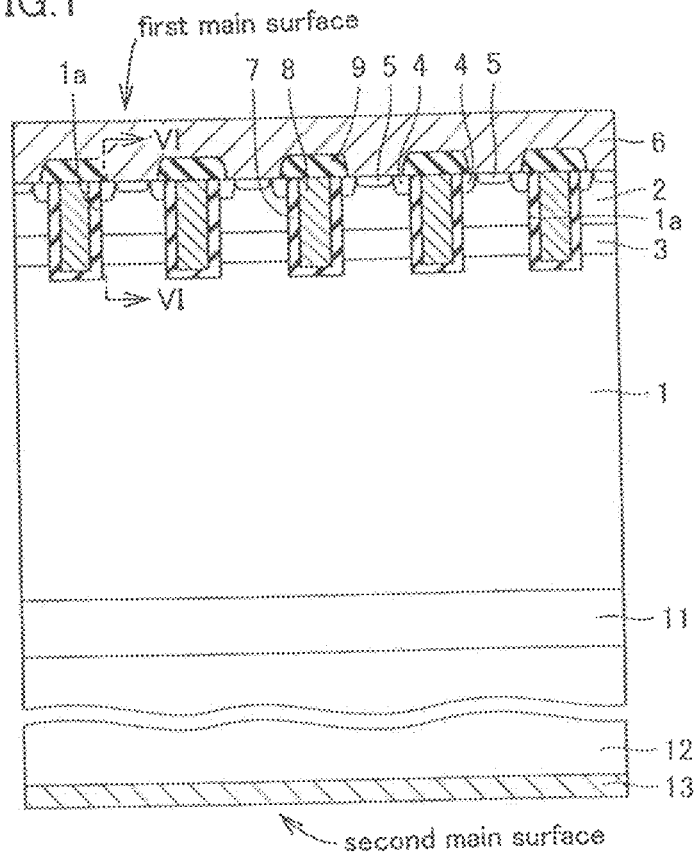
FIG. 1 is a cross-sectional view of a semiconductor device according to a first embodiment of the present invention.
Figure 2:
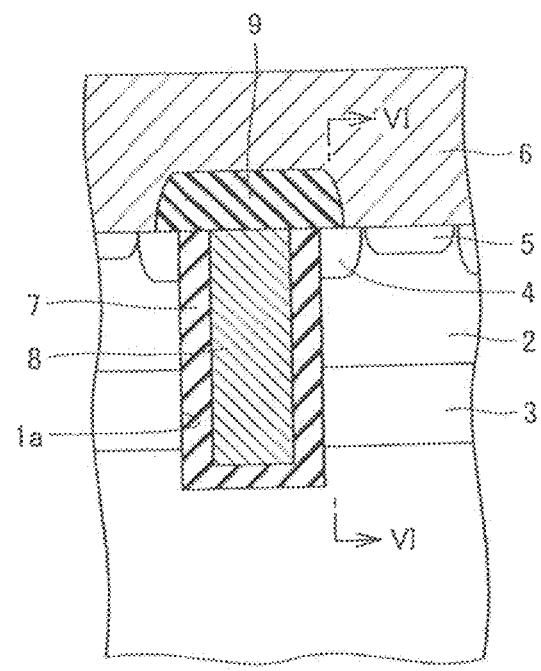
FIG. 2 is a partial enlarged cross-sectional view showing a gate electrode and its neighboring portion.

Here, a punch-through and carrier storage type IGBT is described. As shown in FIGS. 1 and 2, an n-type carrier storage layer 3 is formed in a region at a predetermined depth from one main surface of an N− substrate (N− layer) 1. Further, in a region at a shallower depth from the one main surface of N− substrate 1, a p-type base region 2 is formed to contact carrier storage layer 3. In a predetermined region of a surface of base region 2, an emitter region 4 is formed that is spaced from carrier storage layer 3 with base region 2 therebetween.

Furthermore, in a region except for emitter region 4 of the surface of base region 2, a p+ contact region 5 is formed. An emitter electrode 6 electrically connected to emitter region 4 is formed. Through emitter region 4, base region 2 and carrier storage layer 3, an opening 1*a* is formed to reach an n-type region of N− substrate 1. On the inner wall surface of opening 1a, a gate electrode 8 is formed with a gate insulating film 7 interposed therebetween. On gate electrode 8, an interlayer insulating film 9 is formed to cover gate electrode 8 and gate insulating film 7.

On the other main surface of N− substrate 1, an n-type buffer layer 11 is formed. On buffer layer 11, a p-type collector layer 12 is formed. On a surface of collector layer 12, a collector electrode 13 electrically connected to collector layer 12 is formed. In this carrier storage type IGBT, buffer layer 111 and N− substrate 1 are formed on the p-type substrate acting as collector layer 12 by the epitaxial growth method, as described hereinlater. Therefore, the thickness of collector layer 12 is several times as thick as other layers (substrate).

Figure 3:
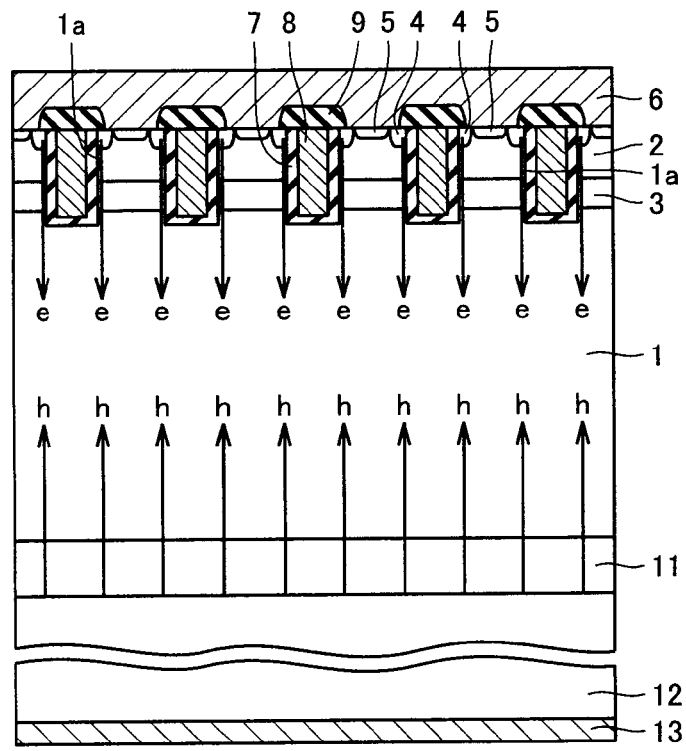
FIG. 3 is a cross-sectional view showing an ON state to illustrate an operation of the semiconductor device in the first embodiment.

A basic operation of the above-described carrier storage type IGBT is described. A positive bias (voltage) of at least a threshold voltage is applied to gate electrode 8 to form a channel region in base region 2 near gate electrode 8. A voltage is applied to collector electrode 13 that is higher than a voltage applied to emitter electrode 6 so as to apply a predetermined voltage between emitter electrode 6 and collector electrode 13. Accordingly, as shown in FIG. 3, electrons "e" flow from emitter region 4 through the channel region and carrier storage layer 3 to N− substrate 1 while holes "h" flow from collector layer 12 toward N− substrate 1. Thus, the carrier storage type IGBT electrically conducts in the forward direction.

Figure 4:
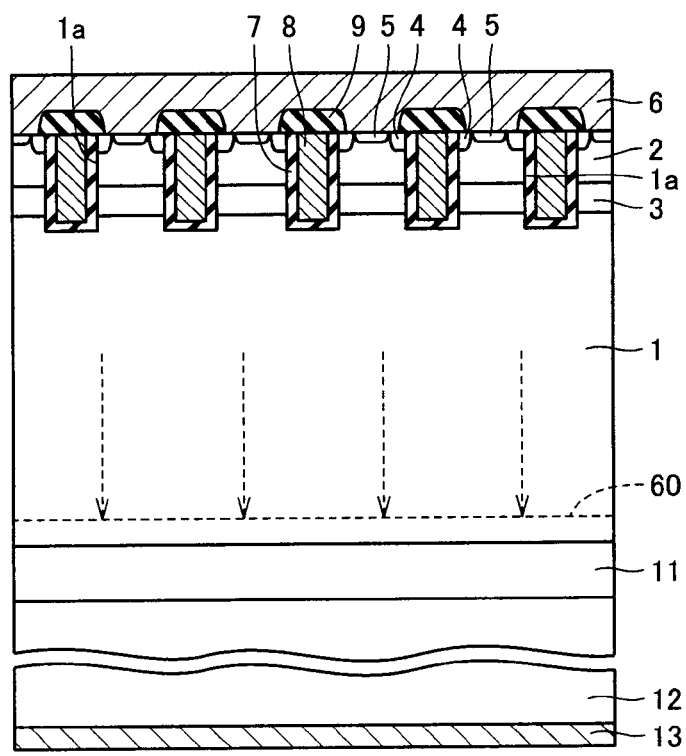
FIG. 4 is a cross-sectional view showing an OFF state to illustrate an operation of the semiconductor device in the first embodiment.

In contrast, a negative bias (voltage) is applied to gate electrode 8. A voltage is applied to collector electrode 13 that is higher than a voltage applied to emitter electrode 6 to apply a predetermined voltage between emitter electrode 6 and collector electrode 13. Accordingly, as shown in FIG. 4, a depletion layer (end) 60 extends from the interface between base region 2 and carrier storage layer 3 of the carrier storage type IGBT toward N− substrate 1 to ensure a high breakdown voltage of the carrier storage type IGBT.

Figure 5:
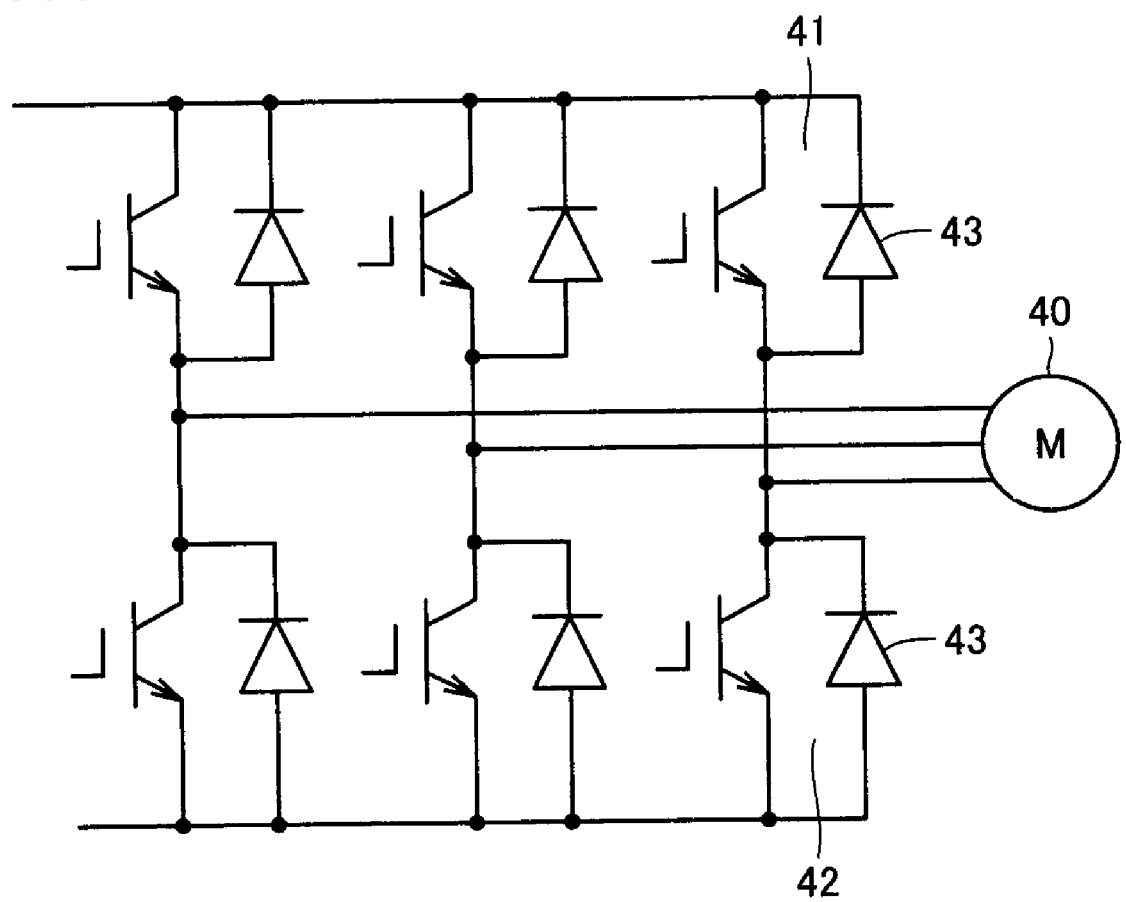
FIG. 5 shows an exemplary inverter circuit using the semiconductor device in the first embodiment.

An exemplary inverter circuit using the carrier storage type IGBT is shown in FIG. 5. An inductive load 40 is for example an electric induction machine. Inductive load 40 is connected to a point of an intermediate potential between an upper arm element 41 and a lower arm element 42. An electric current is flown to inductive load 40 in both of the positive and negative directions. Therefore, in order to return the current flowing through inductive load 40 from a load-connected portion to a high-potential power supply or flow the current from the load-connected portion toward the ground, a freewheel diode 43 is necessary for circulating the current in a closed circuit of inductive load 40 and arm elements 41, 42.

A description is now given of an impurity concentration profile of n-type emitter region 4, p-type base region 2 and n-type carrier storage layer 3 of the carrier storage type IGBT as described above. Emitter region 4 is formed by injecting for example arsenic (As) and base region 2 is formed by injecting for example boron (B). Carrier storage layer 3 is formed by injecting for example phosphorus (P).

Respective concentration profiles of the impurity elements are schematically shown in FIG. 6. The horizontal axis represents the distance (depth) ranging from the surface of emitter region 4 to the n-type region of N− substrate 1, and the vertical axis represents the (relative) concentration. As shown in FIG. 6, an impurity concentration profile 51 of arsenic has a maximum value (peak) of the concentration near the surface of emitter region 4. An impurity concentration profile 52 of boron has a maximum value of the concentration at a deeper position than the position of the maximum impurity concentration of arsenic. Am impurity concentration profile 53 of phosphorus has a maximum value of the concentration at a further deeper position than the position of the maximum concentration of boron.

Namely, arsenic is injected so that its maximum concentration is located in the region where emitter region 4 is to be formed. Boron is injected so that its maximum concentration is located in the region where base region 2 under emitter region 4 is to be formed. Phosphorus is injected so that its maximum concentration is located in the region where carrier storage layer 3 under base region 2 is to be formed. The combined impurity concentration profile corresponds to the relative relation or subtraction between the number (density) of acceptor atoms and the number (density) of donor atoms.

A relation between each impurity concentration profile and the threshold voltage is now described based on evaluations according to simulations. Based on the impurity concentration profiles shown in FIG. 6, a combination of injection conditions providing a threshold voltage Vth of approximately 6.0 V is used for a process/device simulation. The resultant impurity concentration profiles are shown in FIG. 7. The horizontal axis represents the distance (depth: μm) ranging from the surface of emitter region 4 to the n-type region of N− substrate 1, and the vertical axis represents the concentration ($cm^{-3}$).

As shown in FIG. 7, impurity concentration profile 51 of arsenic, impurity concentration profile 52 of boron and impurity concentration profile 53 of phosphorus correspond to respective impurity concentration profiles shown in FIG. 6. A combined (net) impurity concentration profile 50 determined by the subtraction of the impurity atoms has three relative maximum values of the impurity concentration, corresponding to respective maximum values of the impurity concentration of arsenic, boron and phosphorus, in the direction of the depth. According to the simulation under these conditions, an estimate value of threshold voltage Vth is 5.96 V. Here, threshold voltage Vth is one ten-thousandth (1/10000th) of the device current density rating.

The conditions (the amount of injected impurity element for example) under which this impurity concentration profile is obtained are used here as reference conditions, and respective amounts of the impurity elements are increased and decreased to obtain impurity concentration profiles as described below.

FIG. 7 also shows as exemplary aspect of the impurity concentration profiles. In FIG. 7, the position of the maximum impurity concentration of the first impurity region (53) is indicated by FM, and the position of the maximum impurity concentration of the second impurity region (52) is indicated by SM. Further, regarding the combined impurity concentration profile 50 of the first impurity region (53), the second impurity region (52), and the third impurity region (51), the exemplary position of the first relative maximum value corresponding to the impurity concentration of the first impurity in the first impurity region is indicated by CFM (50), and the exemplary position of the second relative maximum value corresponding to the impurity concentration of the second impurity in the second impurity region is indicated by CSM (50).

In an exemplary aspect, the range from the maximum impurity concentration FM (53) of the first impurity to one-tenth of the maximum impurity concentration in the direction of depth is indicated by RF, and the range from the maximum impurity concentration SM (52) of the second impurity to one-tenth of the maximum impurity concentration in the direction of depth is indicated by RS. From FIG. 7, it is seen that the first relative maximum value CFM (50) can be located in the range RF, and the second relative maximum value CSM (50) can be located in the range RS.

First, with respect to the reference conditions, the amount of injected boron is increased by 2% (overdose) and respective amounts of injected arsenic and injected phosphorus are each decreased by 2% (underdose) (Condition A). The resultant impurity concentration profile is shown in FIG. 8. In the simulation under these conditions, threshold voltage Vth is estimated at 6.08 V.

Then, with respect to the reference conditions, the amount of injected boron is decreased by 2% (underdose) and respective amounts of injected arsenic and injected phosphorus are each increased by 2% (overdose) (Condition B). The resultant impurity concentration profile is shown in FIG. 9. In the simulation under these conditions, threshold voltage Vth is estimated at 5.84 V.

Further, with respect to the reference conditions, the amount of injected boron is increased by 5% (overdose) and respective amounts of injected arsenic and phosphorus are each decreased by 5% (underdose) (Condition C). The resultant impurity concentration profile is shown in FIG. 10. In the simulation under these conditions, threshold voltage Vth is estimated at 6.21 V.

Furthermore, with respect to the reference conditions, the amount of injected boron is decreased by 5% (underdose) and respective amounts of injected arsenic and phosphorus are each increased by 5% (overdose) (Condition D). The resultant impurity concentration profile is shown in FIG. 11. In the simulation under these conditions, threshold voltage Vth is estimated at 5.73 V.

Figure 12:
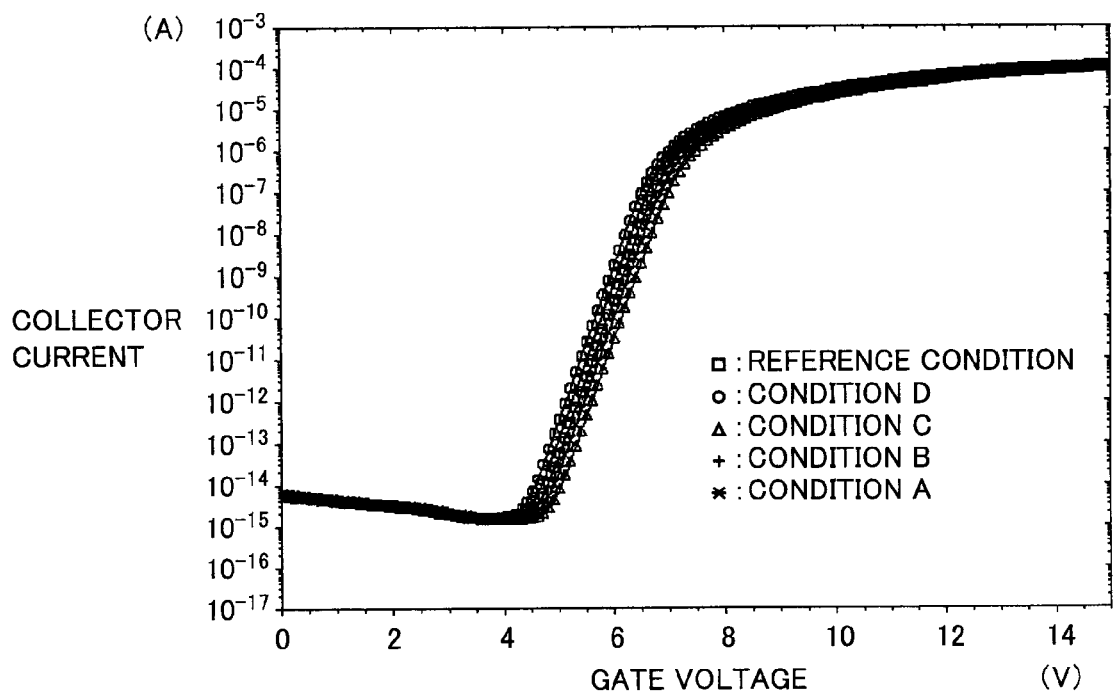
FIG. 12 is a graph showing a relation between the gate voltage and the collector current in each simulation, according to the first embodiment.

Based on the above-described reference conditions and Conditions A to D, the relation between the collector current and the gate voltage is plotted as shown in FIG. 12. The horizontal axis represents the gate voltage and the vertical axis represents the collector current. In this case, under the reference conditions, threshold voltage Vth is 5.96 V. In contrast, by increasing or decreasing the amount (dose) of injected boron (Conditions A to D), threshold voltage Vth is 5.73 V to 6.21 V. Thus, it is seen that the threshold voltage varies in the range from −0.23 V to +0.25 V relative to the threshold voltage under the reference conditions.

Figure 13:
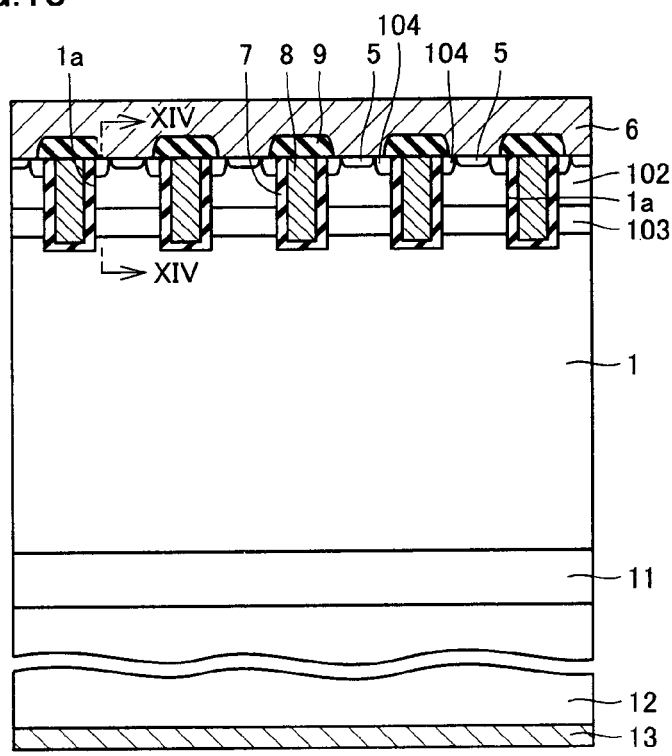
FIG. 13 is a cross-sectional view of a semiconductor device according to a comparative example.

The variation of the threshold voltage is described in connection with a comparative example. FIG. 13 shows a carrier storage type IGBT of the comparative example. As shown in FIG. 13, the configuration of the carrier storage type IGBT of the comparative example is similar to that of the carrier storage type IGBT shown in FIG. 1, except for the impurity concentration profiles of an emitter region 104, a base region 102 and a carrier storage layer 103. Therefore, like components are denoted by like reference characters and the description thereof is not repeated here.

Figure 14:
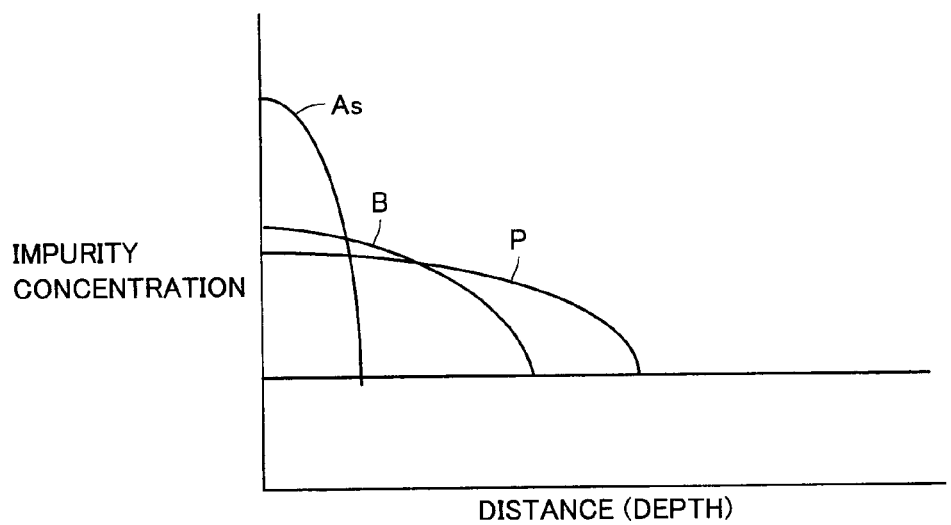
FIG. 14 schematically shows impurity concentration profiles along a line of cross section XIV-XIV shown in FIG. 13, regarding the semiconductor device of the comparative example.
Figure 15:
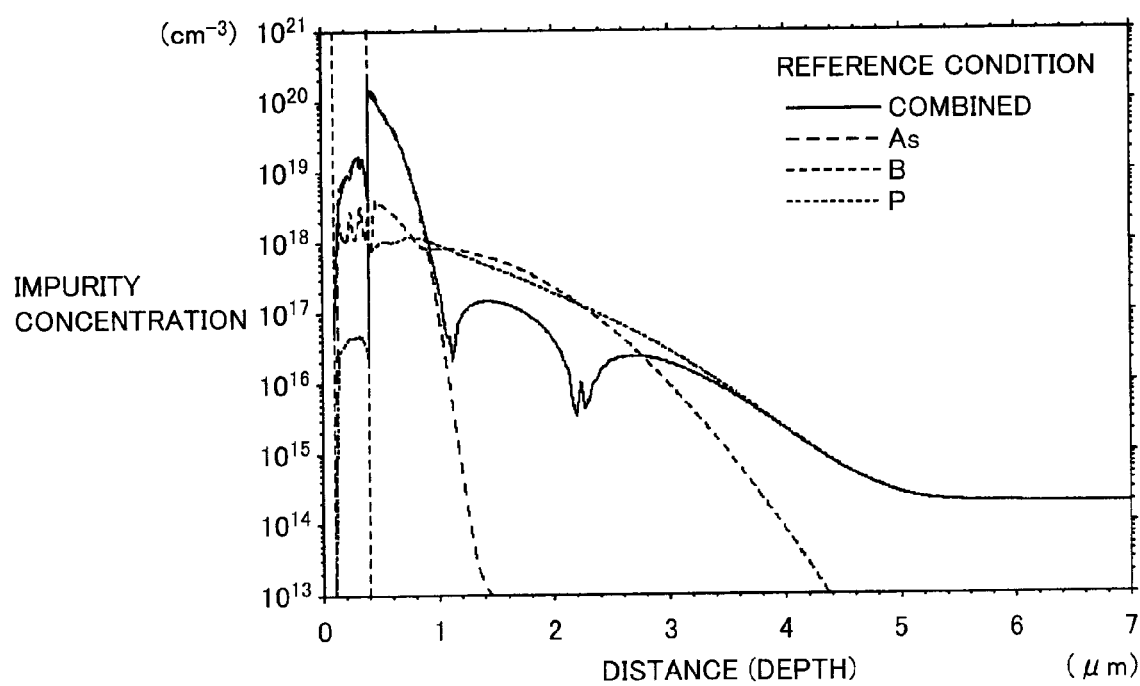
FIGS. 15 to 19 show respective impurity concentration profiles in respective simulations based on first to fifth conditions respectively, regarding the semiconductor device of the comparative example.

As shown in FIG. 14, in the carrier storage type IGBT of the comparative example, respective impurity concentration profiles of emitter region 104, base region 102 and carrier storage layer 103 are Gaussian distributions each having the maximum impurity concentration near the surface. Based on the impurity concentration profiles shown in FIG. 14, a combination of injection conditions providing a threshold voltage Vth of approximately 6.0 V is used in a process/device simulation. The resultant impurity concentration profile is shown in FIG. 15. The horizontal axis represents the distance (depth: μm) ranging from the surface of emitter region 104 to the n-type region of N− substrate 1, and the vertical axis represents the impurity concentration (atms/cm³). According to the simulation under these conditions, threshold voltage Vth is estimated at 6.10 V.

Figure 16:
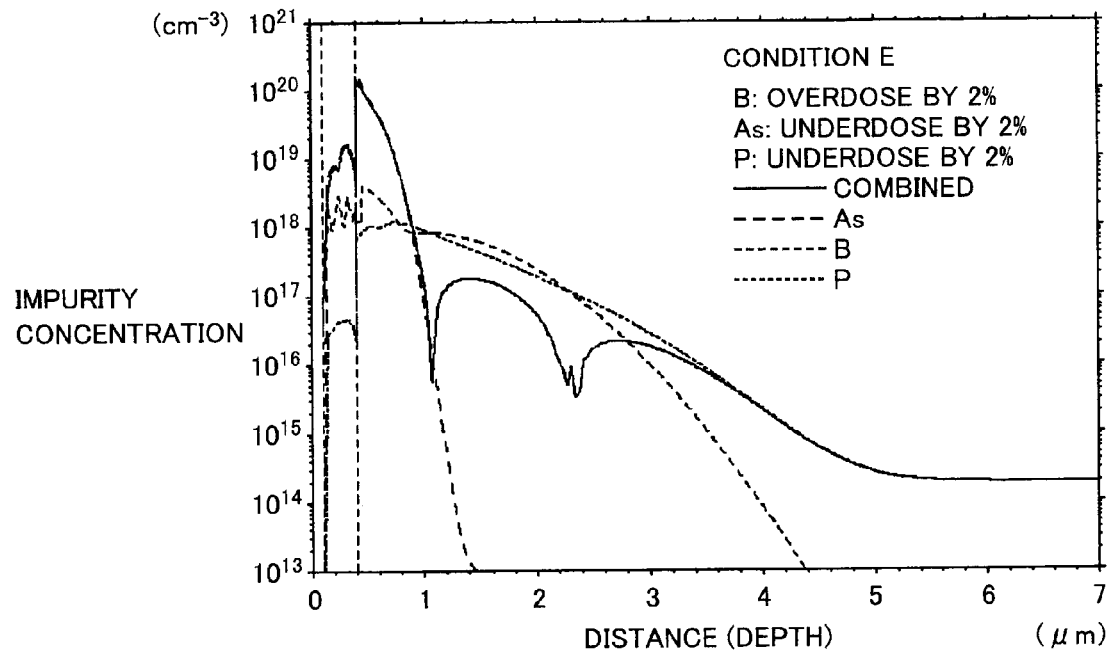

The conditions (the amount of injected impurity element for example) under which the impurity concentration profile is obtained are used as reference conditions. With respect to the reference conditions, the amount of injected boron is increased by 2% (overdose) and respective amounts of injected arsenic and phosphorus are each decreased by 2% (underdose) (Condition E). The resultant impurity concentration profile is shown in FIG. 16. In the simulation under these conditions, threshold voltage Vth is estimated at 6.71 V.

Figure 17:
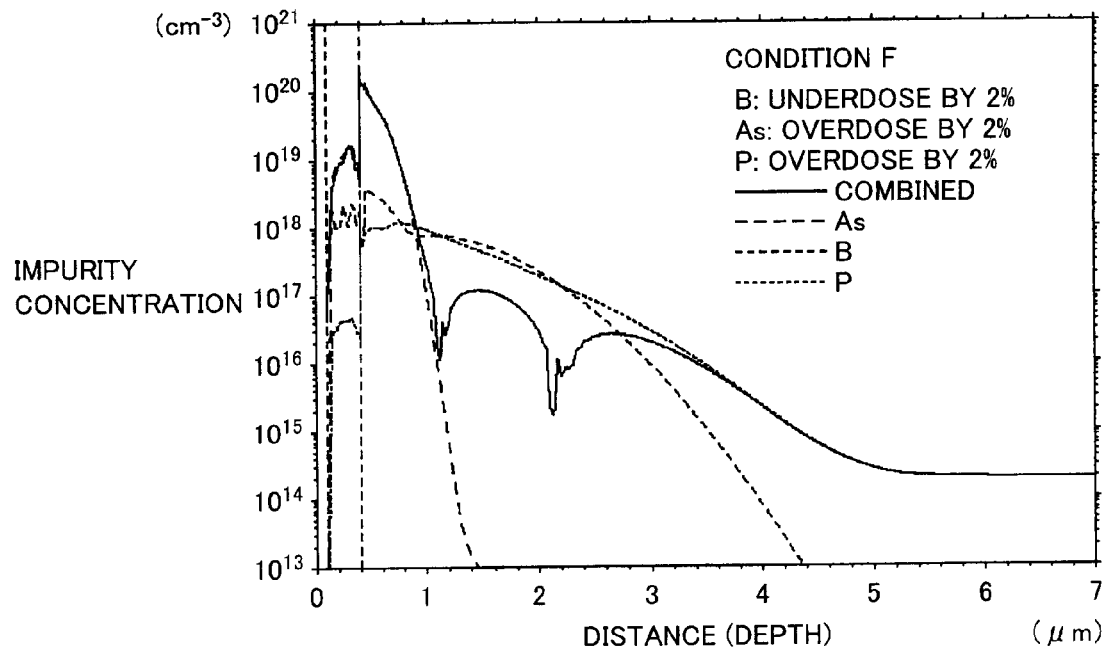

Further, with respect to the reference conditions, the amount of injected boron is decreased by 2% (underdose) and respective amounts of injected arsenic and phosphorus are each increased by 2% (overdose) (Condition F). The resultant impurity concentration profile is shown in FIG. 17. In the simulation under these conditions, threshold voltage Vth is estimated at 4.97 V.

Figure 18:
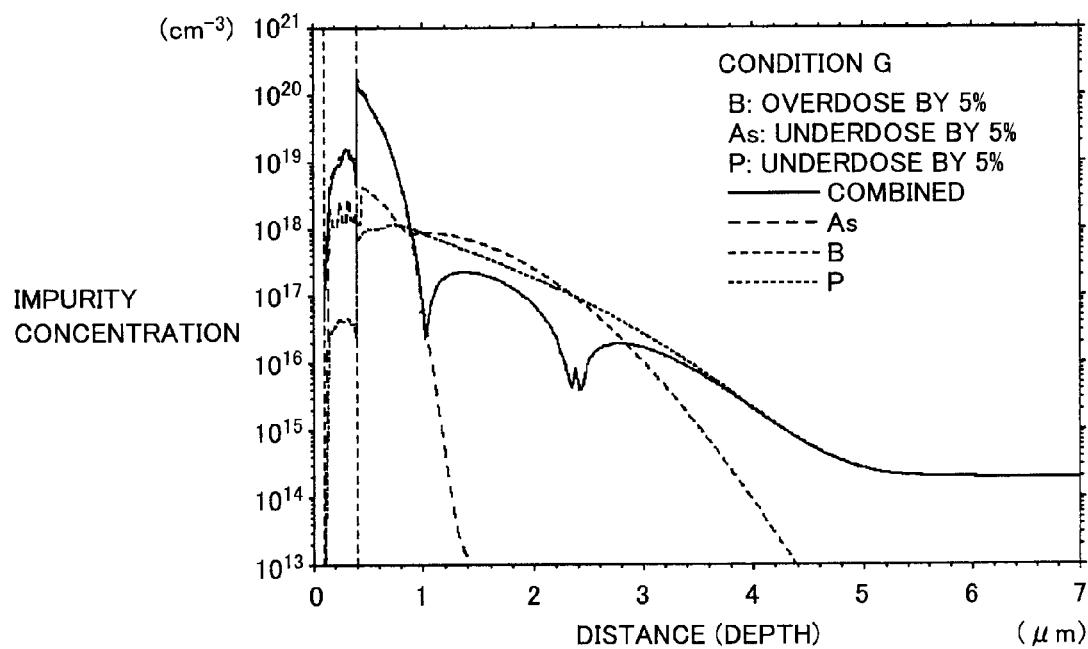

Furthermore, with respect to the reference conditions, the amount of injected boron is increased by 5% (overdose) and respective amounts of injected arsenic and phosphorus are each decreased by 5% (underdose) (Condition G). The resultant impurity concentration profile is shown in FIG. 18. In the simulation under these conditions, threshold voltage Vth is estimated at 7.99 V.

Figure 19:
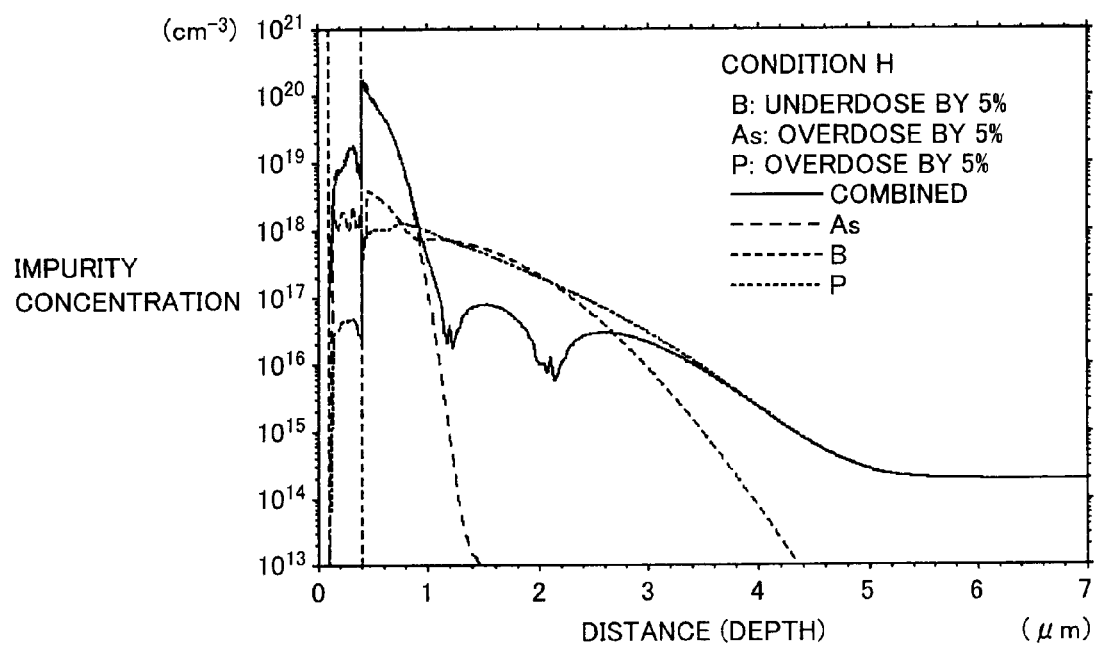

Moreover, with respect to the reference conditions, the amount of injected boron is decreased by 5% (underdose) and respective amounts of injected arsenic and phosphorus are each increased by 5% (overdose) (Condition H). The resultant impurity concentration profile is shown in FIG. 19. In the simulation under these conditions, threshold voltage Vth is estimated at 3.96 V.

Figure 20:
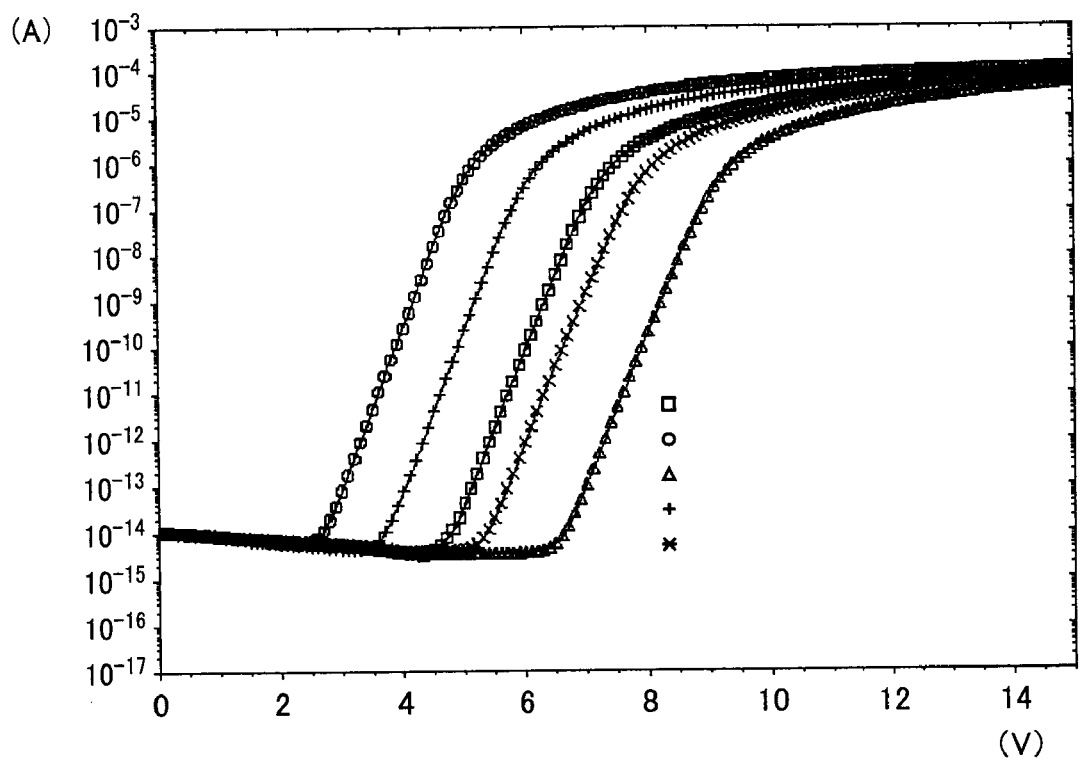
FIG. 20 is a graph showing a relation between the gate voltage and the collector current in each simulation, regarding the semiconductor device of the comparative example.

Under the reference conditions and Conditions E to H described above, the relation between the collector current and the gate voltage is plotted as shown in FIG. 20. The horizontal axis represents the gate voltage and the vertical axis represents the collector current. Under the reference conditions, threshold voltage Vth is 6.10 V. In contrast, in the case where the amount (dose) of injected boron is increased or decreased (Conditions E to H), threshold voltage Vth is 3.96 V to 7.99 V. Thus, it is seen that the threshold voltage varies in the range from −2.14 V to +1.89 V relative to the threshold voltage under the reference conditions.

The results of the evaluation show that, when the amount of injected impurity element is varied to the same extent (the same variation width), the threshold voltage of the carrier storage type IGBT of the comparative example varies in the range from −2.14 V to +1.89 V relative to the threshold voltage under the reference conditions, while the threshold voltage of the carrier storage type IGBT of the present embodiment varies in the range from −0.23 V to +0.25 V. Thus, it is confirmed that the variation of threshold voltage is remarkably reduced.

The reasons why the above-describe results are obtained are described. The impurity concentration is determined by the subtraction between the number of donor atoms and the number of acceptor atoms in each region. In the carrier storage type IGBT of the present embodiment, respective impurity concentration profiles of emitter region 4, base region 2 and carrier storage layer 3 each have the position (depth) of the maximum impurity concentration that is set in a corresponding region or the position (depth) where the layer is formed.

Therefore, in the region where emitter region 4 is formed, the concentration of the impurity forming emitter region 4 is sufficiently higher (a few orders) than respective concentrations of impurities forming base region 2 and carrier storage layer 3. Thus, influences of the impurities forming base region 2 and carrier storage layer 3 on the impurity concentration of finally formed emitter region 4 are considerably suppressed. This is applied as well to remaining base region 2 and carrier storage layer 3. Regarding emitter region 4, base region 2 and carrier storage layer 3, influences of respective impurities forming two of the three regions (layer) on the impurity concentration of the remaining one region (layer) are suppressed.

Thus, regarding emitter region 4, base region 2 and carrier storage layer 3, influences of variations of respective amounts of injected impurities forming two regions (layer) on the impurity concentration of the remaining one region (layer) are suppressed. Consequently, variation of the threshold voltage of the carrier storage type IGBT can be reduced.

In order to effectively suppress variation of the threshold voltage, it is preferable that the relative maximum value corresponding to the maximum impurity concentration of phosphorus, among the three relative maximum values of the combined impurity concentration profile, is in the range from the maximum impurity concentration of phosphorus to one tenth of the maximum impurity concentration. Further, the relative maximum value corresponding to the maximum impurity concentration of boron is preferably in the range from the maximum impurity concentration of boron to one tenth of the maximum impurity concentration. The relative maximum value corresponding to the maximum impurity concentration of arsenic is preferably in the range from the maximum impurity concentration of arsenic to one tenth of the maximum impurity concentration.

Figure 21:
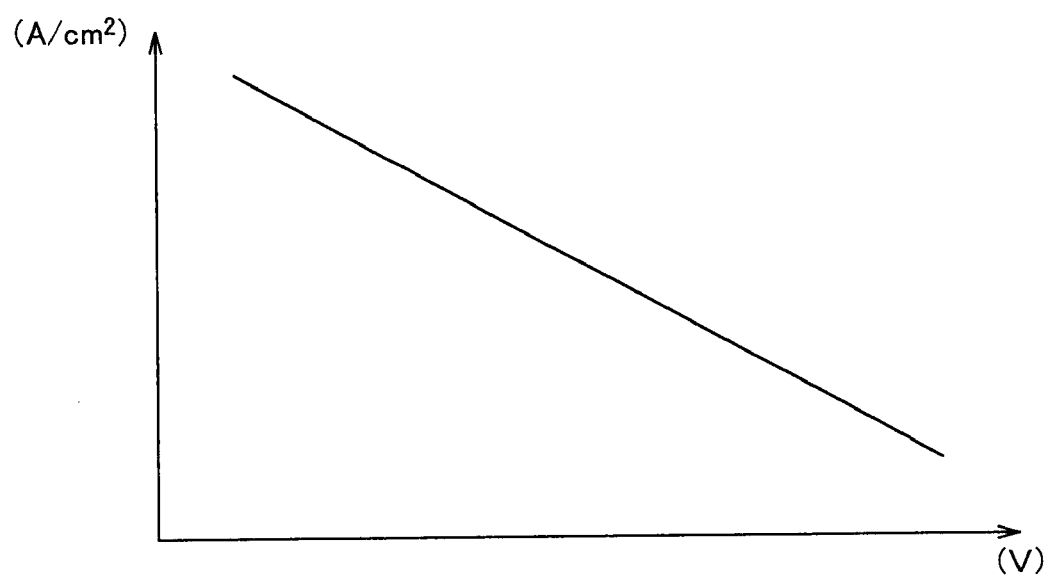
FIG. 21 is a graph showing a relation between the saturation current value and the threshold voltage in the first embodiment.

The effects as described below are obtained by reducing variation of the threshold voltage of the carrier storage type IGBT. Between the threshold voltage and the saturation current (Isat) of the carrier storage type IGBT, there is the negative relation as shown in FIG. 21. Specifically, as the threshold voltage (Vth) decreases, the saturation current value gradually increases. In contrast, as the threshold voltage increases, the saturation current value gradually decreases.

Because of the requirement that the carrier storage type IGBT should have the electrical conduction capability of approximately ten times as high as the current density rating, the saturation current is restricted in actual use in that the saturation current cannot be decreased to be lower than a certain value. Therefore, the threshold voltage cannot be set to an inappropriately large value and the carrier storage type IGBT is required to have a threshold voltage that is at most a certain predetermined voltage.

Figure 22:
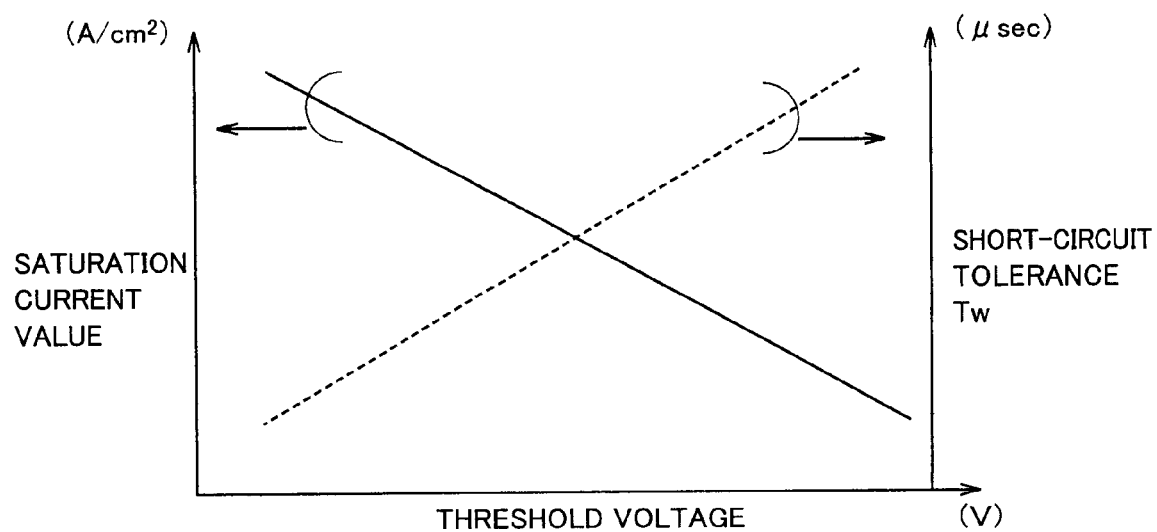
FIG. 22 is a graph showing a relation between the saturation current value and the threshold voltage as well as a relation between the short-circuit tolerance and the threshold voltage in the first embodiment.

Further, as shown in FIG. 22, there is also the negative relation between the saturation current value (A/cm$^2$) and the load short-circuit tolerance time (Tw). As the saturation current value decreases, the load short-circuit tolerance time becomes longer. In contrast, as the saturation current value increases, the load short-circuit tolerance time becomes shorter. Therefore, a carrier storage type IGBT having a relatively lower threshold voltage has a shorter load short-circuit tolerance time. A carrier storage type IGBT having a relatively higher threshold voltage has a longer load short-circuit tolerance time. In order to have the load short-circuit tolerance time of a certain time or longer, the saturation current value has to be a certain value or less, and the carrier storage type IGBT has to have the threshold voltage of a certain predetermined value or more. If the threshold voltage decreases below the certain value, the semiconductor device could be broken in the load short-circuit mode operation.

As described above, regarding the carrier storage type IGBT of the present embodiment, the range of variation of the threshold voltage can be reduced to a remarkable degree with respect to variation of a predetermined amount of injected impurities (reference conditions), as compared with the carrier storage type IGBT of the comparative example. Thus, variation of the saturation current value of the carrier storage type IGBT can be reduced and variation of the short-circuit tolerance can be reduced. Further, it does not occur that the threshold voltage varies to become lower than a certain predetermined voltage so that breakage of the carrier storage type IGBT in the load short-circuit mode operation can be prevented.

Regarding the impurity concentration profile of the carrier storage type IGBT, the position (depth) of the maximum impurity concentration is set at a position (depth) where the corresponding region or layer is to be formed. Therefore, as compared with the case where the impurities are diffused from the surface, the amount of injected impurities can be reduced remarkably. Further, the temperature of heat treatment can be reduced and the heat treatment time can be shortened. In this way, the throughput in manufacturing the carrier storage type IGBT can be improved.

Second Embodiment

Figure 23:
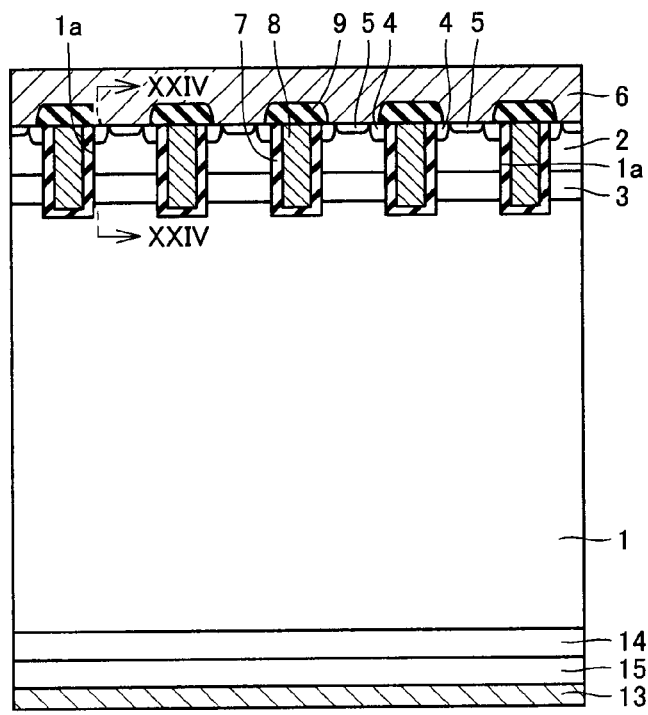
FIG. 23 is a cross-sectional view of a semiconductor device according to a second embodiment the present invention.

Here, a light punch-through and carrier storage type IGBT is described. As shown in FIG. 23, on the other main surface of N− substrate 1, an n-type buffer layer 14 is formed. On buffer layer 14, a p-type collector layer 15 is formed. On a surface of collector layer 15, a collector electrode 13 electrically connected to collector layer 15 is formed. As for the light punch-through type, buffer layer 14 and collector layer 15 are formed to have a smaller thickness than buffer layer 11 and collector layer 12 of the punch-through and carrier storage type IGBT. Other components are similar to those of the carrier storage type IGBT shown in FIG. 1. Therefore, like components are denoted by like reference characters and the description thereof is not repeated.

Figure 24:
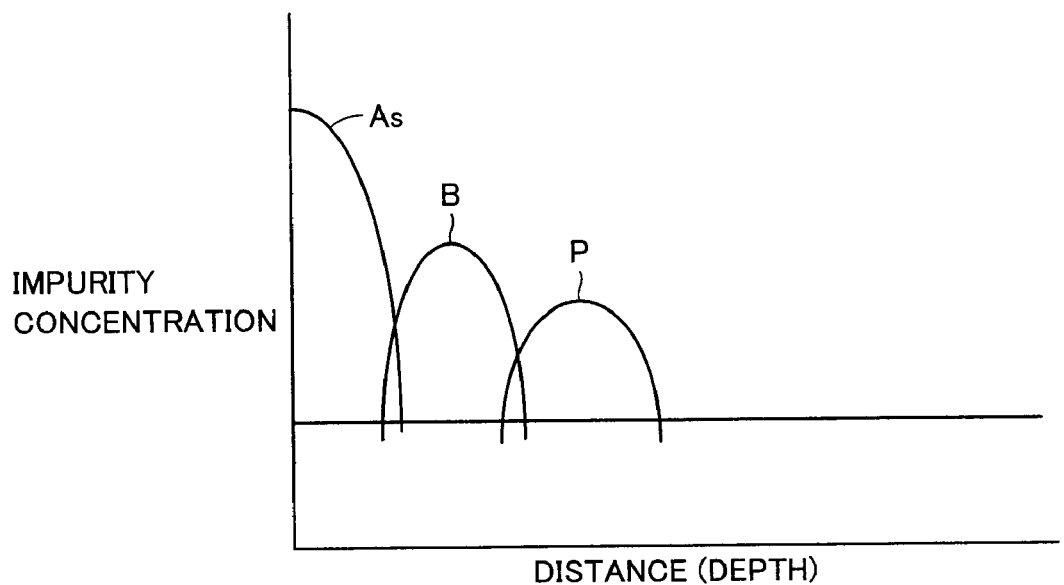
FIG. 24 schematically shows impurity concentration profiles along a line of cross section XXIV-XXIV shown in FIG. 23 in the second embodiment.

N-type emitter region 4, p-type base region 2 and carrier storage layer 3 have respective impurity concentration profiles as described below. The impurity concentration profiles are similar to those of the carrier storage type IGBT shown in FIG. 1. FIG. 24 schematically shows the impurity concentration profiles. As shown in FIG. 24, the position (depth) of the maximum impurity concentration corresponds to the position (depth) where the corresponding region or layer should be formed.

A basic operation of the above-described carrier storage type IGBT is described. The basic operation is similar to that of the carrier storage type IGBT shown in FIG. 1. A voltage equal to or larger than the threshold voltage is applied to gate electrode 8. Between emitter electrode 6 and collector electrode 13, a predetermined voltage is applied (voltage applied to the collector>voltage applied to the emitter). Accordingly, electrons "e" flow from emitter region 4 through the channel region and carrier storage layer 3 to N− substrate 1, while holes "h" flow from collector layer 12 toward N− substrate 1. Thus, carrier storage type IGBT electrically conducts in the forward direction (see FIG. 3).

In contrast, a negative bias voltage is applied to gate electrode 8 and a predetermined voltage is applied between emitter electrode 6 and collector electrode 13 (voltage applied to the collector>voltage applied to the emitter). Accordingly, a depletion layer extends from the interface between base region 2 and carrier storage layer 3 of the carrier storage type IGBT toward the region of N− substrate 1. Thus, a high breakdown voltage of the carrier storage type IGBT is ensured (see FIG. 4).

Regarding the above-described carrier storage type IGBT, the position (depth) of the maximum impurity concentration is provided to correspond to the position (depth) where the corresponding one of emitter region 4, base region 2 and carrier storage layer 3 is to be formed, as described in connection with the first embodiment. Thus, even if the amount of injected impurities varies from a predetermined injection amount, variation of the threshold voltage can be reduced remarkably. Therefore, variation of the saturation current of the carrier storage type IGBT can be reduced and variation of the short-circuit tolerance can be reduced. Further, it does not occur that the threshold voltage varies to become lower than a certain predetermined voltage, and breakage of the carrier storage type IGBT in load short-circuit mode operation can be prevented.

Moreover, since the position (depth) of the maximum impurity concentration is provided to correspond to the position (depth) where the corresponding one of emitter region 4, base region 2 and carrier storage layer 3 is to be formed, the amount of injected impurities can be remarkably reduced as compared with the case where impurities are diffused from the surface. Further, the temperature of heat treatment can be decreased and the period of time for heat treatment can be shortened. Consequently, the throughput in manufacturing the carrier storage type IGBT can be improved.

Third Embodiment

Figure 25:
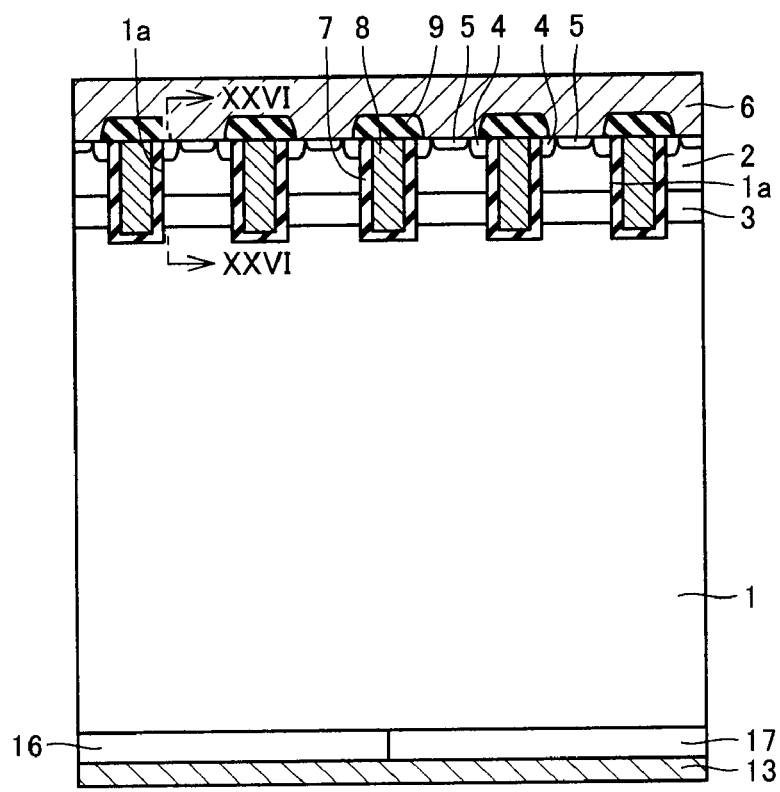
FIG. 25 is a cross-sectional view of a semiconductor device according to a third embodiment of the present invention.

Here, a reverse conduction and carrier storage type IGBT is described. As shown in FIG. 25, on the other main surface of N− substrate 1, a p-type collector region 16 and an n-type cathode region 17 are formed. On the surface of collector region 16 and cathode region 17, a collector electrode 13 is formed in the state connected to collector region 16 and cathode region 17. Other components are similar to those of the carrier storage type IGBT shown in FIG. 1. Therefore, like components are denoted by like reference characters and the description thereof is not repeated.

Figure 26:
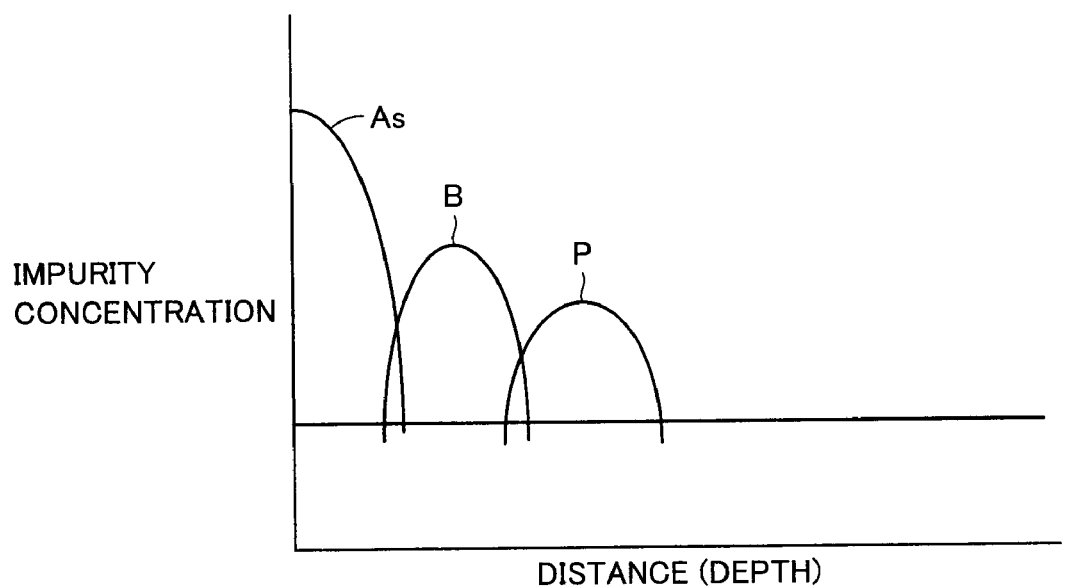
FIG. 26 schematically shows impurity concentration profiles along a line of cross section XXVI-XXVI shown in FIG. 25 in the third embodiment.

N-type emitter region 4, p-type base region 2 and carrier storage layer 3 have impurity concentration profiles as described below. The impurity concentration profiles are similar to those of the carrier storage type IGBT shown in FIG. 1. The impurity concentration profiles are schematically shown in FIG. 26. As shown in FIG. 26, the position (depth) of the maximum impurity concentration is set to correspond to the position (depth) where the corresponding region or layer should be formed.

Figure 27:
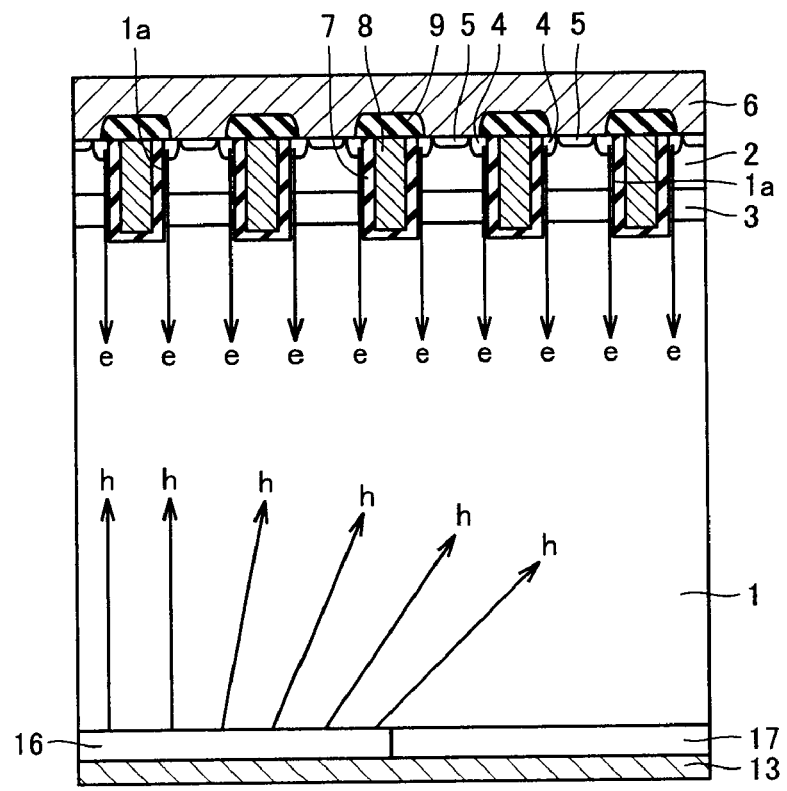
FIG. 27 shows an electrical conduction state to illustrate an operation of the semiconductor device in the third embodiment.

A basic operation of the above-described carrier storage type IGBT is described. A positive bias (voltage) equal to or larger than the threshold voltage is applied to gate electrode 8. Between emitter electrode 6 and collector electrode 13, a predetermined voltage is applied (voltage applied to the emitter<voltage applied to the collector). Accordingly, as shown in FIG. 27, electrons "e" flow from emitter region 4 through the channel region and carrier storage layer 3 to N− substrate 1, while holes "h" flow from collector region 16 toward N− substrate 1. Thus, the reverse conduction and carrier storage type IGBT electrically conducts in the forward direction.

Figure 28:
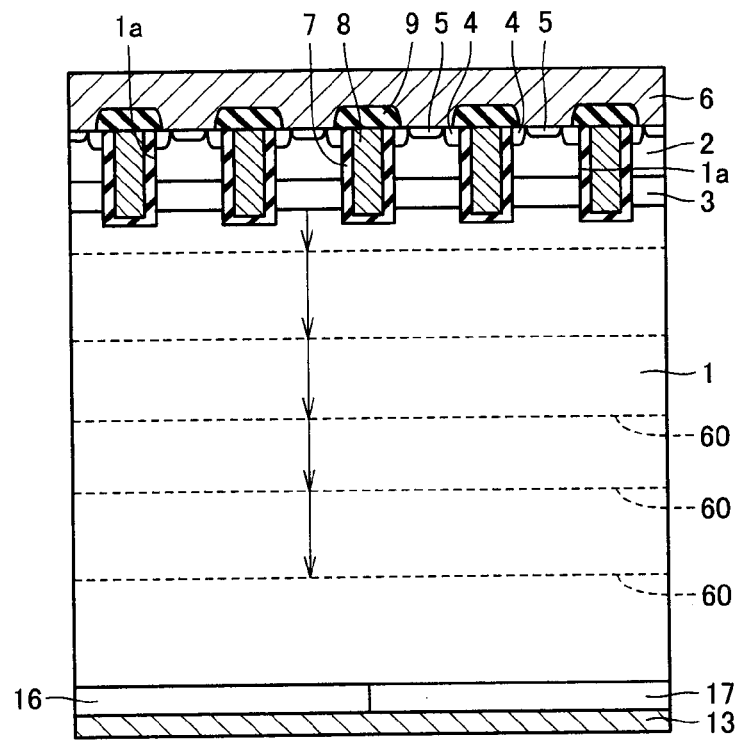
FIG. 28 shows an OFF state to illustrate an operation of the semiconductor device in the third embodiment.

Between emitter electrode 6 and collector electrode 13, a predetermined voltage is applied (voltage applied to the emitter<voltage applied to the collector). Thus, as shown in FIG. 28, a depletion layer (end) 60 extends from the interface between base region 2 and carrier storage layer 3 toward the region of N− substrate 1. In this way, a high breakdown voltage of the reverse conduction and carrier storage type IGBT is ensured.

Figure 29:
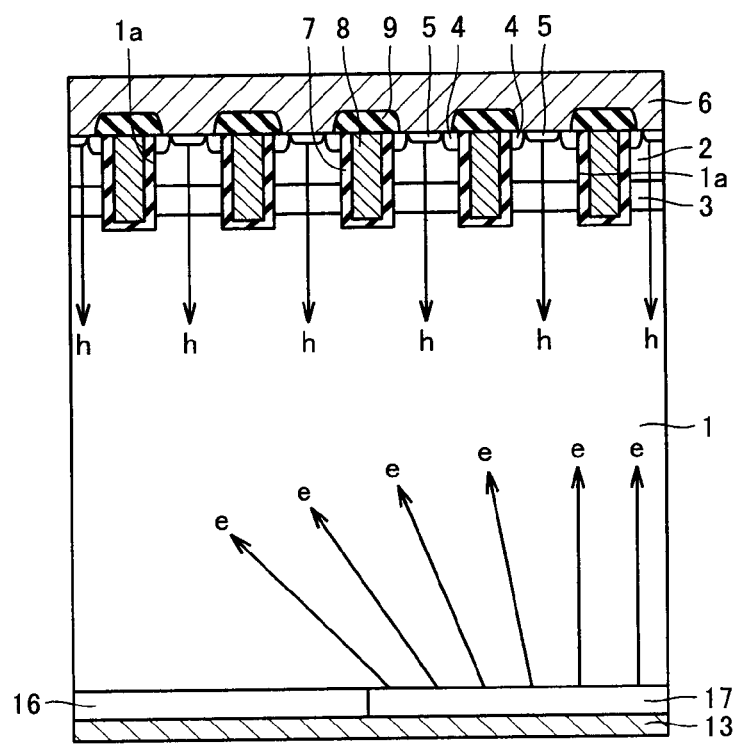
FIG. 29 shows a reverse conduction state to illustrate an operation of the semiconductor device in the third embodiment.

To gate electrode 8, a voltage equal to or lower than the threshold voltage is applied. Between emitter electrode 6 and collector electrode 13, a predetermined voltage is applied (voltage applied to the emitter>voltage applied to the collector). Thus, as shown in FIG. 29, holes "h" flow from p+ contact region 5 through base region 2 and carrier storage layer 3 to N− substrate 1, while electrons "e" flow from cathode region 17 toward N− substrate 1. Thus, the reverse conduction and carrier storage type IGBT electrically conducts in the reverse direction.

Regarding the above-described carrier storage type IGBT, the position (depth) of the maximum impurity concentration is provided to correspond to the position (depth) where the corresponding one of emitter region 4, base region 2 and carrier storage layer 3 is to be formed, as described in connection with the first embodiment. Thus, even if the amount of injected impurities varies from a predetermined injection amount, variation of the threshold voltage can be reduced remarkably. Therefore, variation of the saturation current of the carrier storage type IGBT can be reduced and variation of the short-circuit tolerance can be reduced. Further, it does not occur that the threshold voltage varies to become lower than a certain predetermined voltage, and breakage of the carrier storage type IGBT in load short-circuit mode operation can be prevented.

Moreover, since the position (depth) of the maximum impurity concentration is provided to correspond to the position (depth) where the corresponding one of emitter region 4, base region 2 and carrier storage layer 3 is to be formed, the amount of injected impurities can be remarkably reduced as compared with the case where impurities are diffused from the surface. Further, the temperature of heat treatment can be lowered and the period of time for heat treatment can be shortened. Consequently, the throughput in manufacturing the carrier storage type IGBT can be improved.

Fourth Embodiment

Figure 30:
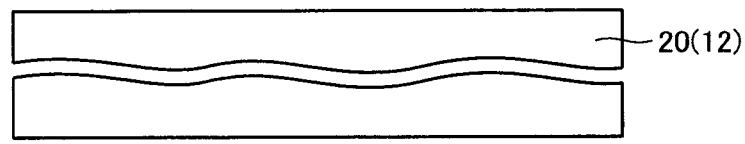
FIG. 30 is a cross-sectional view showing a step of a method of manufacturing a semiconductor device according to a fourth embodiment of the present invention.
Figure 31:
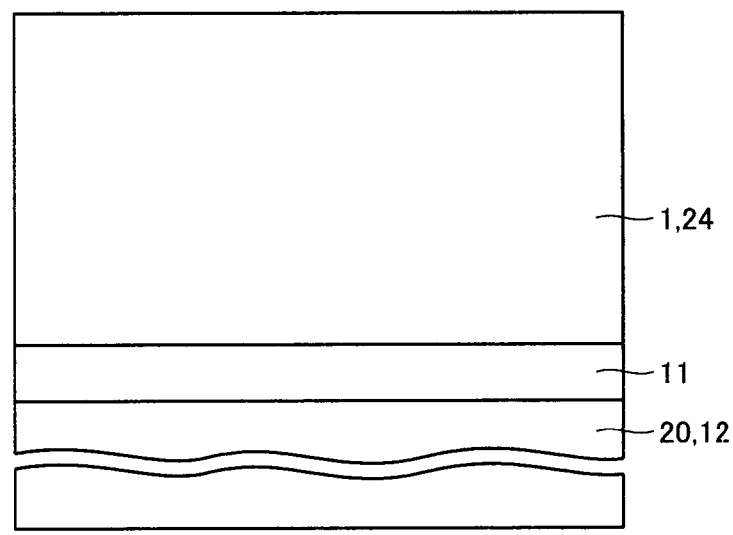
FIGS. 31 to 40 are cross-sectional views showing respective steps performed after respective steps shown in FIGS. 30 to 39 in the fourth embodiment.

Here, a method of manufacturing the carrier storage type IGBT shown in FIG. 1 is described. As shown in FIG. 30, a p-type substrate 20 of approximately 500 μm in thickness that is to be used as p-type collector layer 12 is prepared. Then, as shown in FIG. 31, on a main surface of p-type substrate 20, n-type buffer layer 11 of approximately 10 to 60 μm in thickness is formed by the epitaxial growth method. Further, on a surface of buffer layer 11, an N− layer 24 of approximately 30 to 150 μm in thickness that is to be used as N− substrate 1 is formed by epitaxial growth method.

Figure 32:
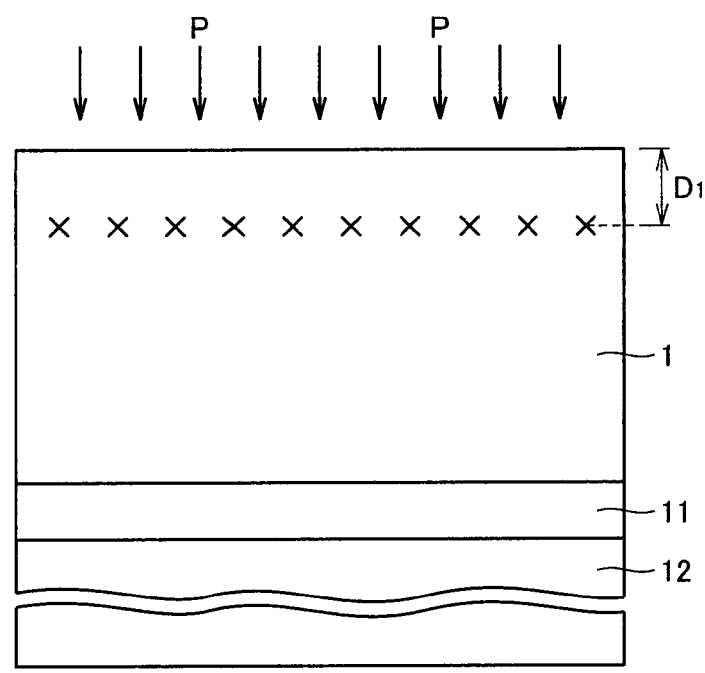
Figure 33:
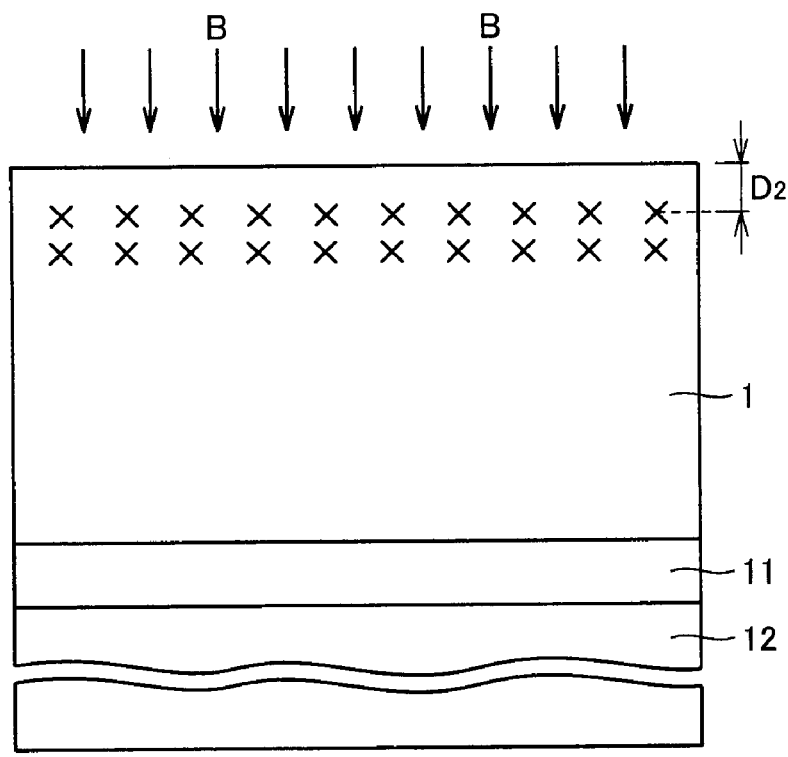

Then, as shown in FIG. 32, to a main surface of N− substrate 1, phosphorus is selectively injected as n-type impurity under the conditions for example that the dose is $1\times10^{11}$ cm$^{-2}$ to $1\times10^{13}$ cm$^{-2}$ and the acceleration energy is 500 KeV to 4 MeV. Accordingly, phosphorus is injected to have the maximum concentration located at a predetermined depth $D_1$ corresponding to the position where the carrier storage layer is formed (see FIG. 6 or 7). Then, as shown in FIG. 33, to the main surface of N− substrate 1, boron is selectively injected as p-type impurity under the conditions for example that the dose is $1\times10^{12}$ cm$^{-2}$ to $1\times10^{14}$ cm$^{-2}$ and the acceleration energy is 200 KeV to 2 MeV. Accordingly, boron is injected to have the maximum concentration located at a predetermined depth $D_2$ corresponding to the position where the base region is formed (see FIG. 6 or 7).

Figure 34:
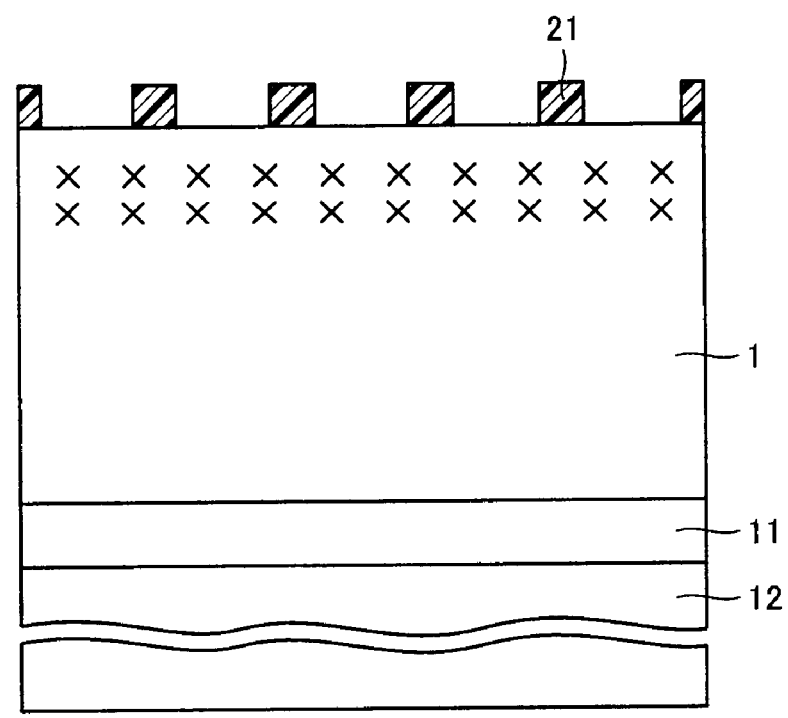
Figure 35:
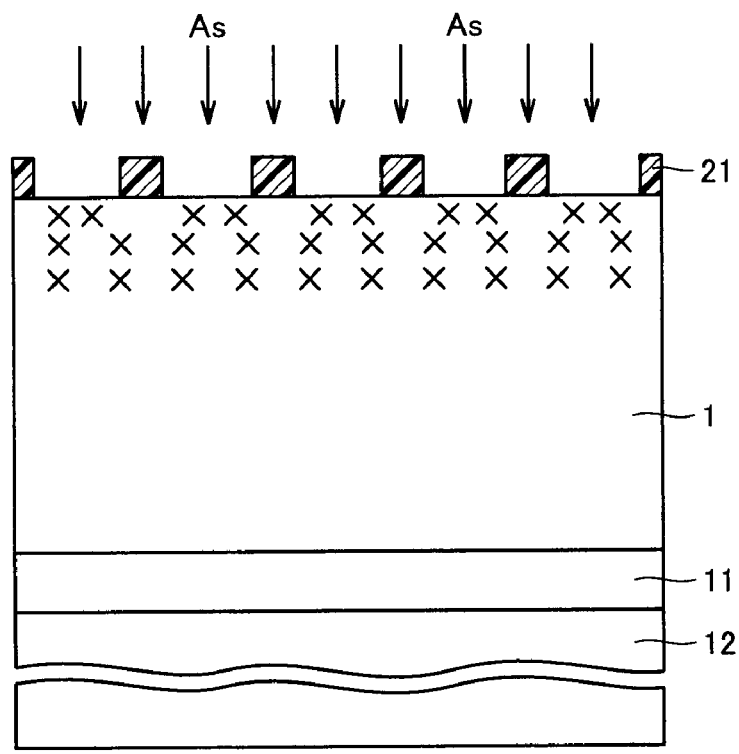

Then, as shown in FIG. 34, a predetermined resist pattern 21 for forming the emitter region is formed on the main surface of N− substrate 1. Next, as shown in FIG. 35, arsenic is injected as n-type impurity using resist pattern 21 as a mask, under the conditions for example that the dose is $1\times10^{13}$ cm$^{-2}$ to $5\times10^{15}$ cm$^{-2}$ and the acceleration energy is 30 KeV to 200 KeV. Accordingly, arsenic is injected to have the maximum concentration located in or near the surface of N−substrate 1 where the emitter region is formed (see FIG. 6 or 7). After this, resist pattern 21 is removed.

Figure 36:
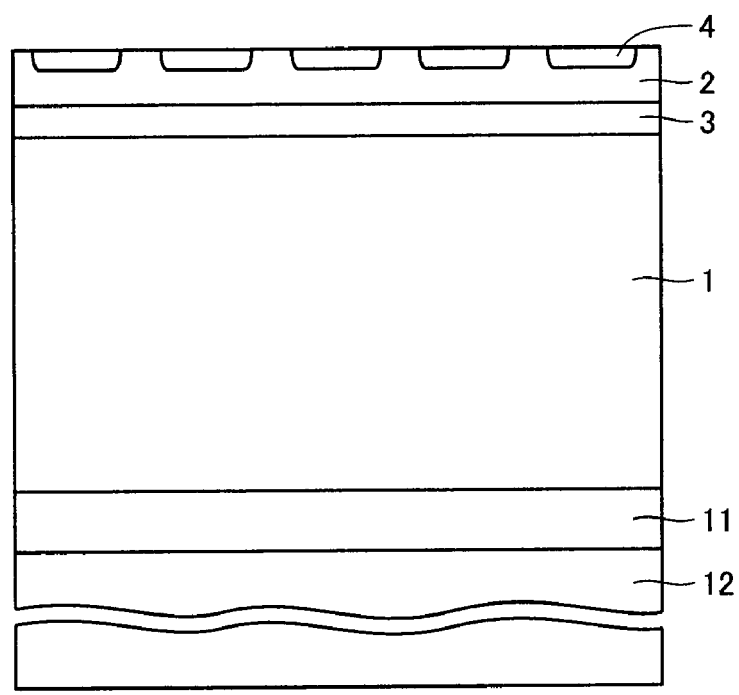

Then, as shown in FIG. 36, heat treatment is performed for example at a temperature of approximately 950° C. to 1150° C. in a nitrogen ($N_2$) ambient or oxygen ($O_2$) ambient for approximately 20 minutes to 2 hours. Thus, the phosphorus, boron and arsenic injected to N− substrate 1 are diffused to form respective regions that are to act as p-type base region 2, n-type carrier storage layer 3 and n-type emitter region 4. The ambient of the heat treatment may alternatively be an ambient of a mixture of nitrogen ($N_2$) and oxygen ($O_2$) or the ambient of the mixture to which hydrogen ($H_2$) is added.

Figure 37:
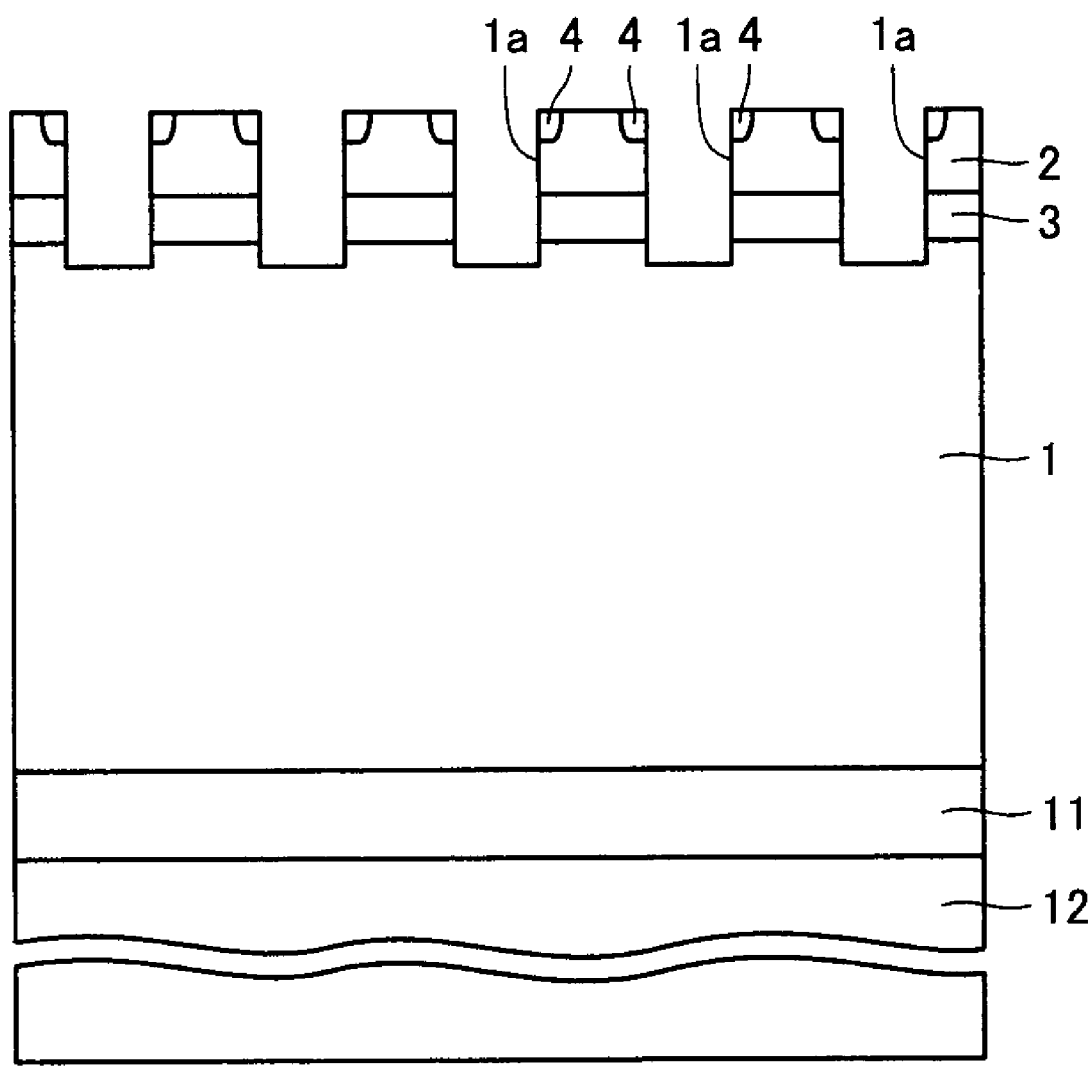
Figure 38:
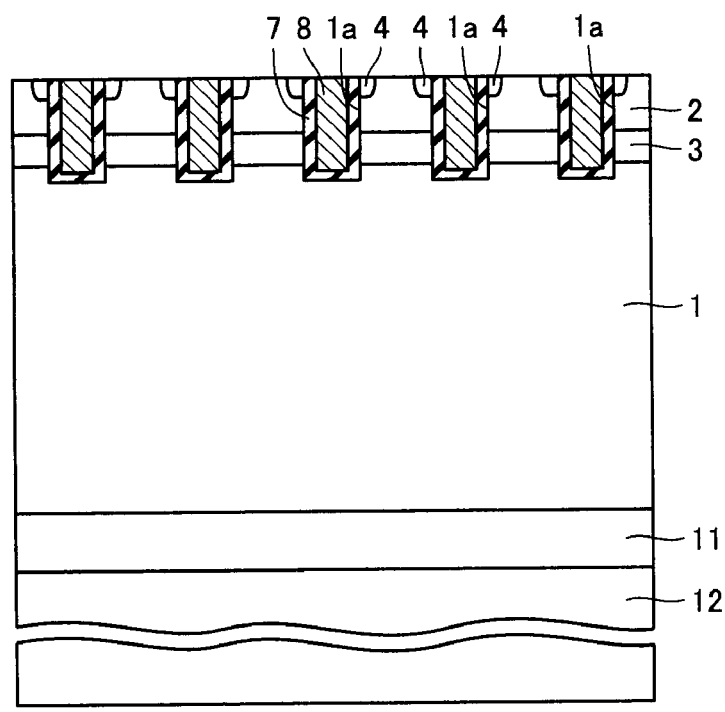

Next, as shown in FIG. 37, opening 1a is formed through respective regions that are to act as emitter region 4, base region 2 and carrier storage layer 3 to reach an n-type region of N− substrate 1. Then, an insulating film (not shown) is formed on the main surface of N− substrate 1 (on the surface of base region 2 and emitter region 4) to cover the sidewall surface and the bottom surface of opening 1a. Then, a polysilicon film (not shown) is formed on the insulating film to fill the inside of opening 1a. Then, the portion of the polysilicon film and the portion of the insulating film located on the main surface of N− substrate 1 are removed to form gate electrode 8 on the sidewall substrate of opening 1a with gate insulating film 7 interposed therebetween, as shown in FIG. 38.

Figure 39:
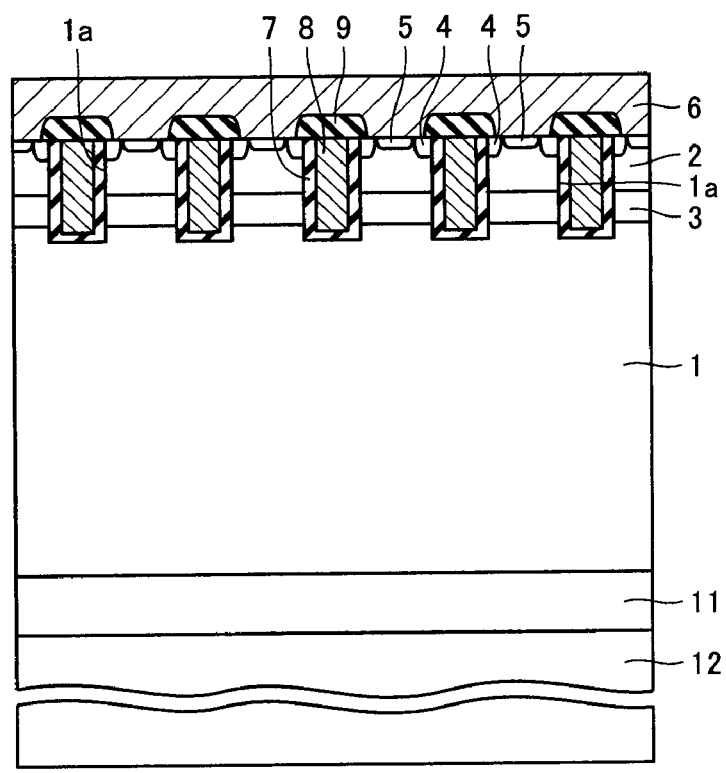
Figure 40:
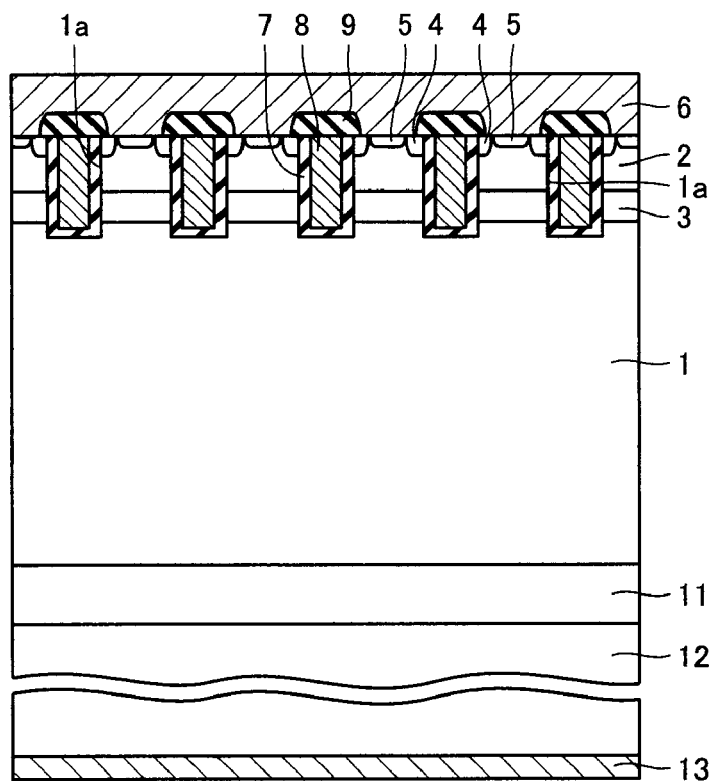

Next, as shown in FIG. 39, interlayer insulating film 9 is formed to cover gate electrode 8 and gate insulating film 7. Next, and electrically conductive emitter electrode layer 6 is formed to cover interlayer insulating film 9. The emitter electrode 6 is connected to emitter region 4 and base region 2. Then, as shown in FIG. 40, collector electrode 13 is formed on the main surface of collector layer 12. In this way, the punch-through and carrier storage type IGBT shown in FIG. 1 is formed According to the above-described method, in the process of injecting the impurity for forming emitter region 4, base region 2 and carrier storage layer 3 each, the impurity is injected to have the maximum impurity concentration located at the position (depth) corresponding to the position (depth) where the corresponding one of emitter region 4, base region 2 and carrier storage layer 3 is formed. In this way, as described above, regarding emitter region 4, base region 2 and carrier storage layer 3, influences of impurities forming two regions (layer) of the three regions (layer) on the impurity concentration of the remaining one region (layer) are suppressed. As a result, variation of the threshold voltage of the carrier storage type IGBT can be reduced to a considerable degree.

Moreover, since the position (depth) of the maximum impurity concentration is provided to correspond to the position (depth) where the corresponding one of emitter region 4, base region 2 and carrier storage layer 3 is to be formed, the amount of injected impurities can be remarkably reduced as compared with the case where impurities are diffused from the surface. Further, the temperature of heat treatment can be lowered and the time for heat treatment can be shortened. Consequently, the throughput in manufacturing the carrier storage type IGBT can be improved to contribute to improvement of productivity.

Fifth Embodiment

Figure 41:
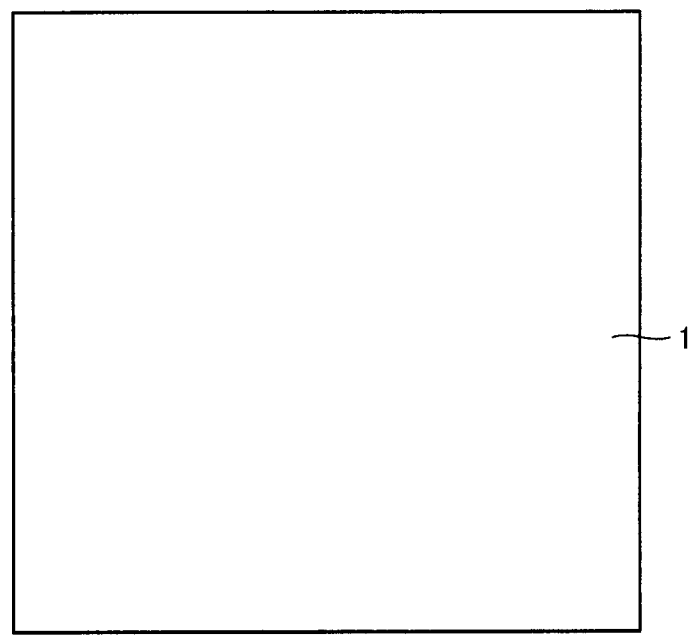
FIG. 41 is a cross-sectional view showing a step of a method of manufacturing a semiconductor device according to a fifth embodiment of the present invention.
Figure 42:
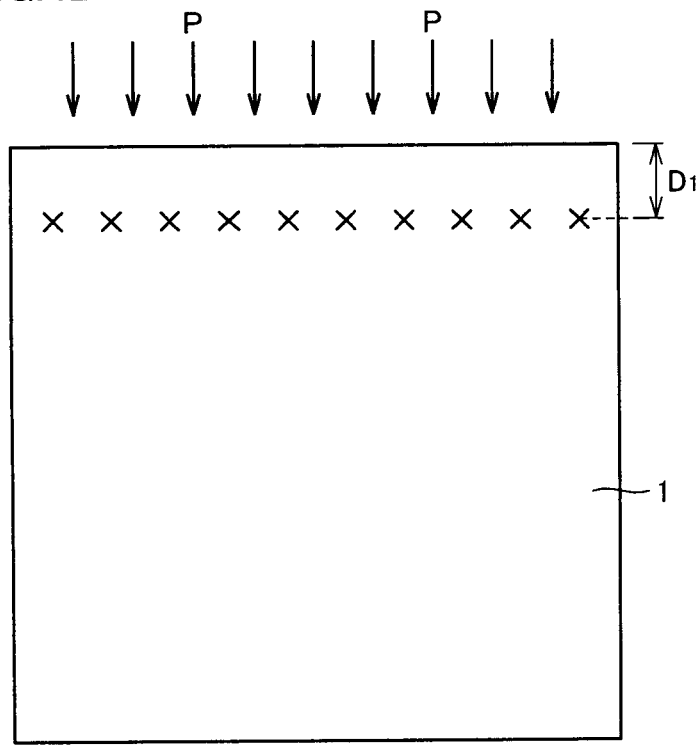
FIGS. 42 to 53 are cross-sectional views showing respective steps performed after respective steps shown in FIGS. 41 to 52.

Here, a method of manufacturing the carrier storage type IGBT shown in FIG. 23 is described. As shown in FIG. 41, N− substrate 1 is prepared. Then, as shown in FIG. 42, to a main surface of N− substrate 1, phosphorus is selectively injected as n-type impurity under the conditions for example that the dose is $1\times10^{11}$ cm$^{-2}$ to $1\times10^{13}$ cm$^{-2}$ atms/cm$^2$ and the acceleration energy is 500 KeV to 4 MeV. Accordingly, phosphorus is injected to have the maximum concentration located at predetermined depth $D_1$ corresponding to the position where the carrier storage layer is formed (see FIG. 24).

Figure 43:
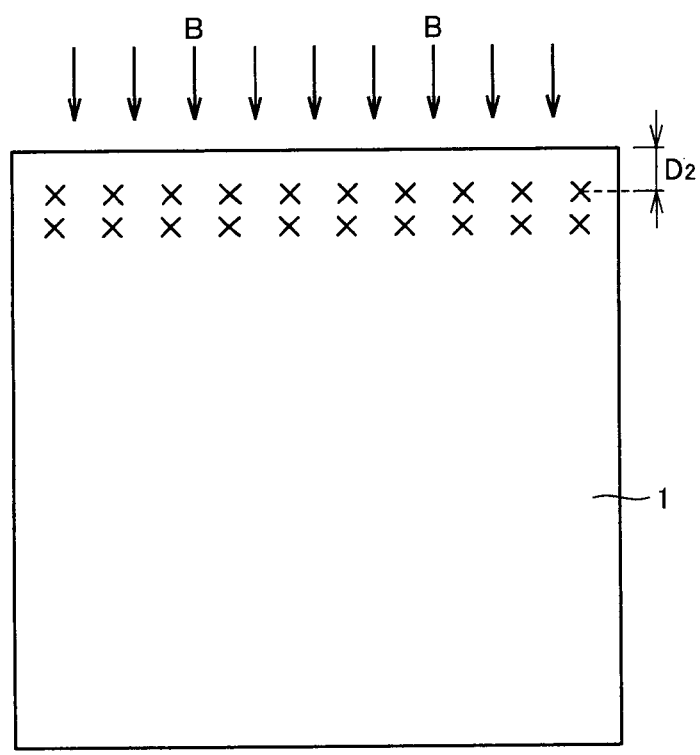

Then, as shown in FIG. 43, to the main surface of N− substrate 1, boron is selectively injected as p-type impurity under the conditions for example that the dose is $1\times10^{12}$ cm$^{-2}$ to $1\times10^{14}$ cm$^{-2}$ and the acceleration energy is 200 KeV to 2 MeV. Accordingly, boron is injected to have the maximum concentration located at predetermined depth $D_2$ corresponding to the position where the base region is formed (see FIG. 24).

Figure 44:
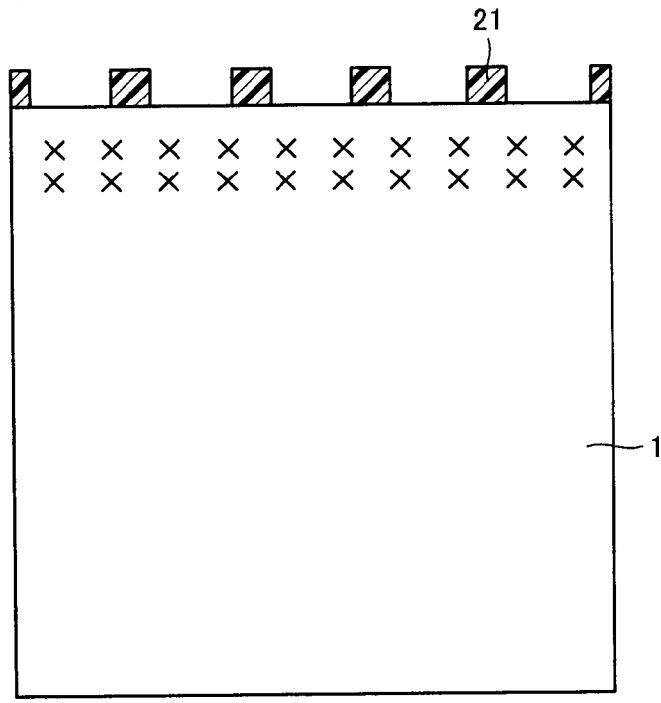
Figure 45:
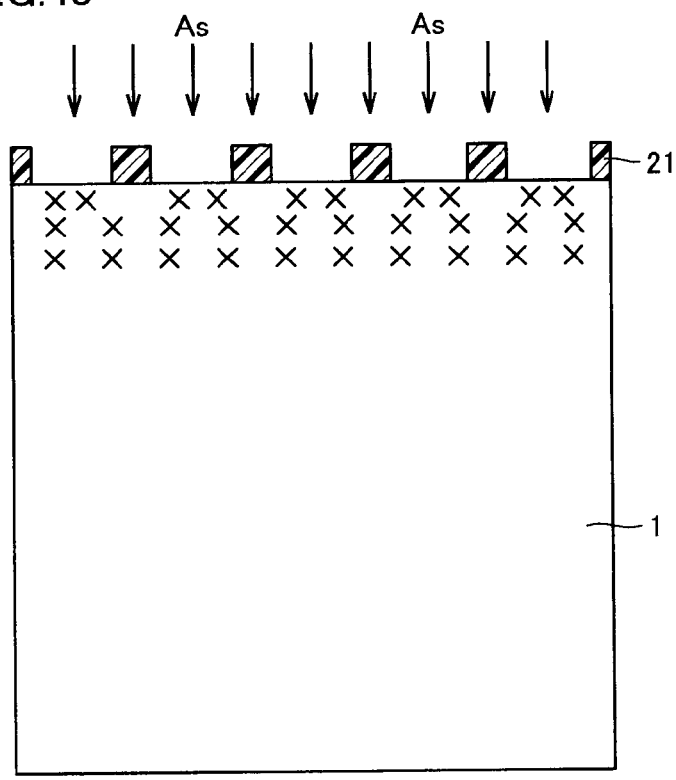

Then, as shown in FIG. 44, predetermined resist pattern 21 for forming the emitter region is formed on the main surface of N− substrate 1. Next, as shown in FIG. 45, arsenic is injected as n-type impurity under the conditions for example that the dose is $1\times10^{13}$ cm$^{-2}$ to $5\times10^{15}$ cm$^{-2}$ and the acceleration energy is 30 KeV to 200 KeV, using resist pattern 21 as a mask. Accordingly, arsenic is injected to have the maximum concentration in or near the surface of N− substrate 1 where the emitter region is formed (see FIG. 24). Resist pattern 21 is thereafter removed.

Figure 46:
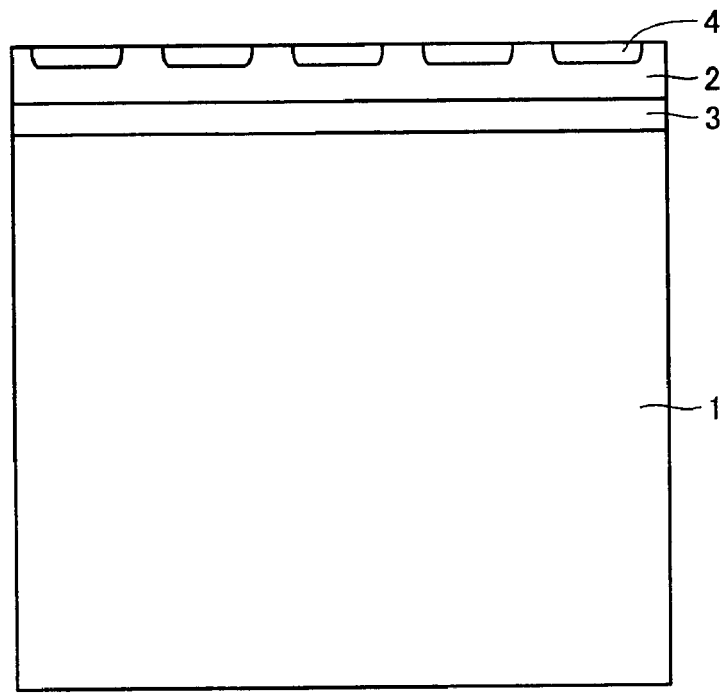

Then, as shown in FIG. 46, heat treatment is performed for example at a temperature of approximately 950° C. to 1150° C. in a nitrogen ($N_2$) ambient or oxygen ($O_2$) ambient for approximately 20 minutes to 2 hours, to diffuse the phosphorus, boron and arsenic injected to N− substrate 1 and thereby form respective regions acting as p-type base region 2, n-type carrier storage layer 3 and n-type emitter region 4. The ambient of the heat treatment may alternatively be an ambient of a mixture of nitrogen ($N_2$) and oxygen ($O_2$) or the ambient of the mixture to which hydrogen ($H_2$) is added.

Figure 47:
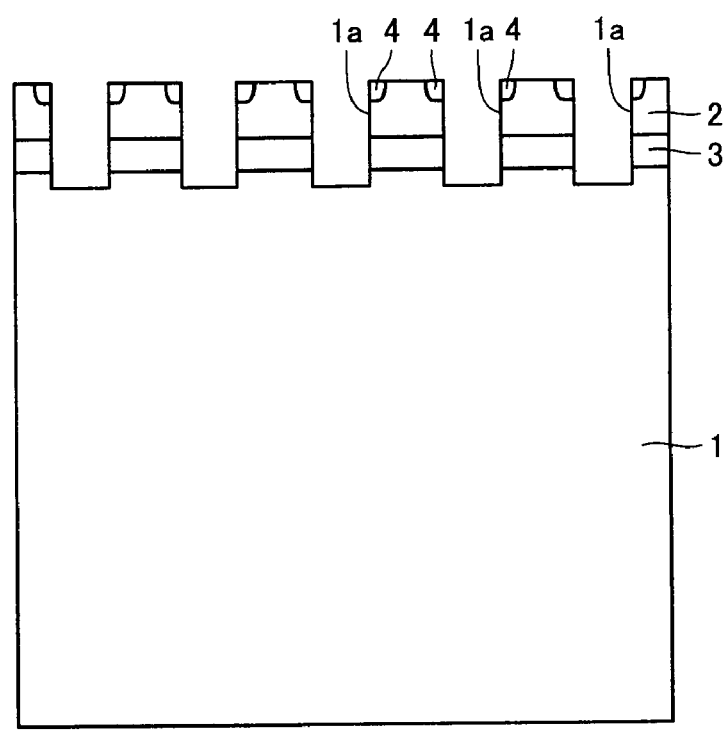
Figure 48:
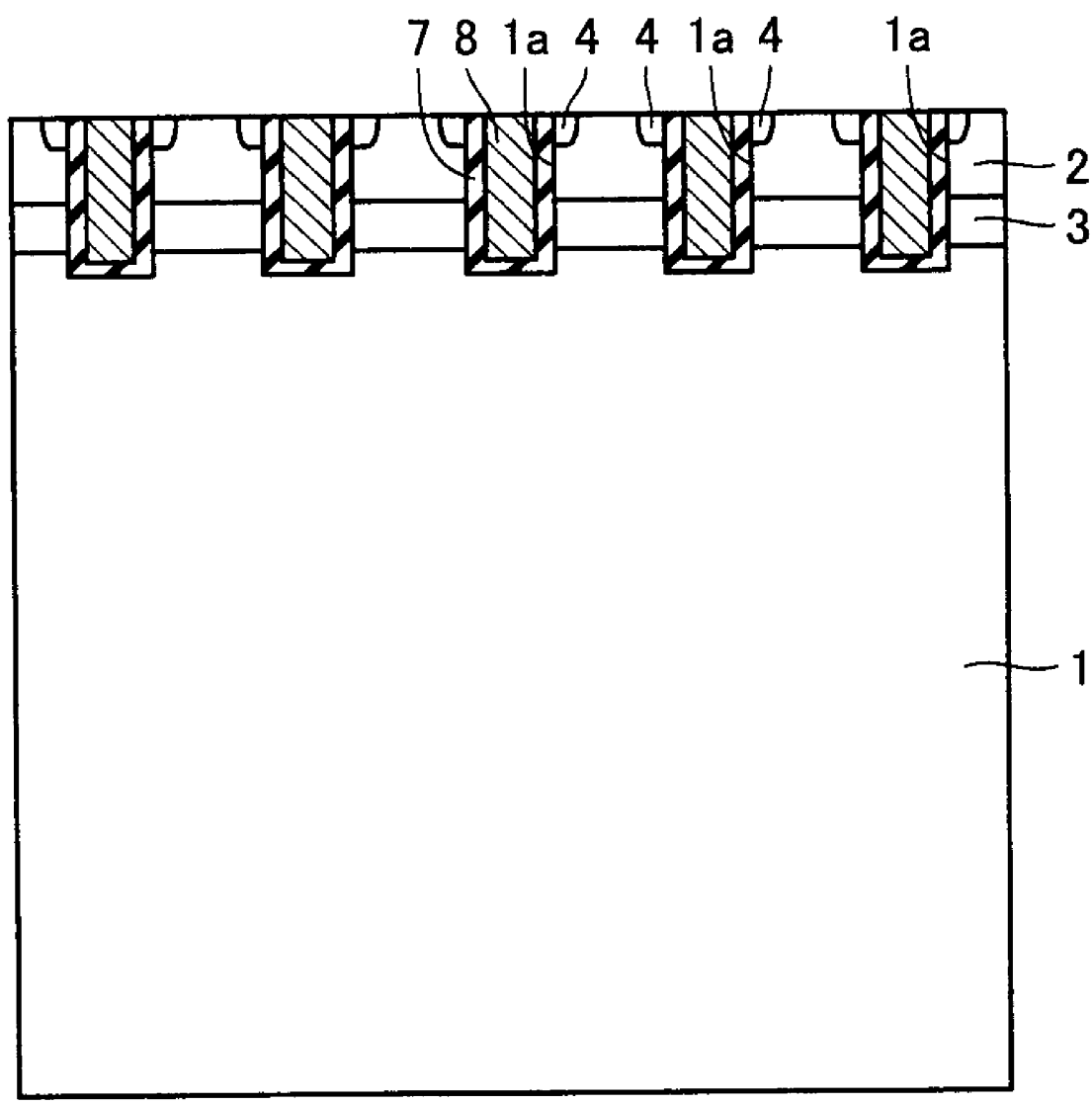

Next, as shown in FIG. 47, opening 1a is formed through respective regions that are to act as emitter region 4, base region 2 and carrier storage layer 3 to reach an n-type region of N− substrate 1. Next, an insulating film (not shown) is formed on the main surface of N− substrate 1 (on the surface of base region 2 and emitter region 4) to cover the sidewall surface and the bottom surface of opening 1a. Then, a polysilicon film (not shown) is formed on the insulating film to fill the inside of opening 1a. Then, the portion of the polysilicon film and the portion of the insulating film located on the main surface of N− substrate 1 are removed to form gate electrode 8 on the sidewall surface of opening 1a with gate insulating film 7 interposed therebetween, as shown in FIG. 48.

Figure 49:
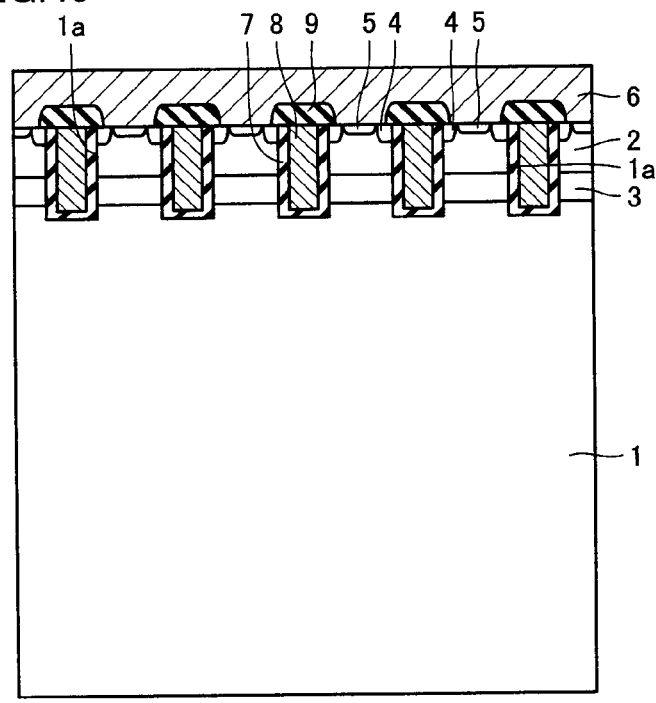
Figure 50:
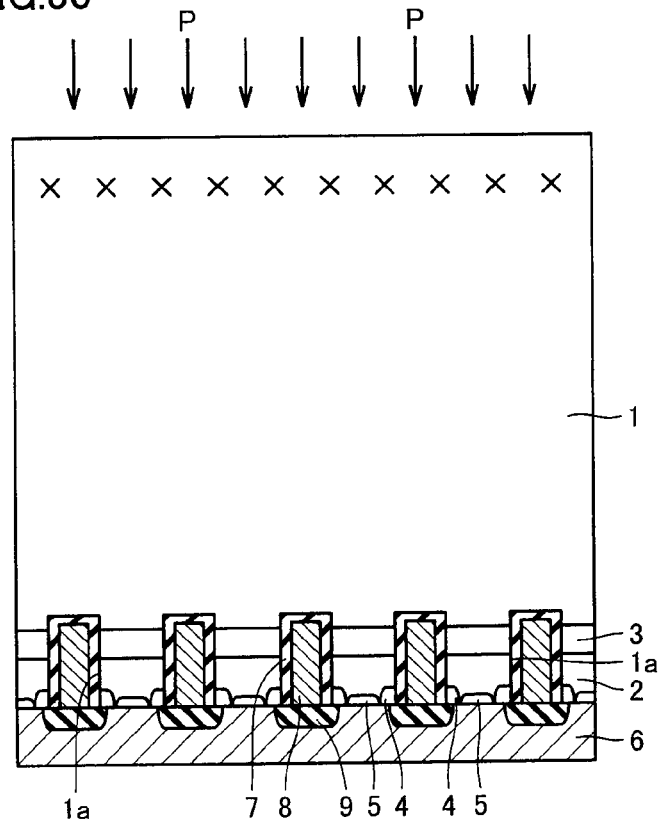
Figure 51:
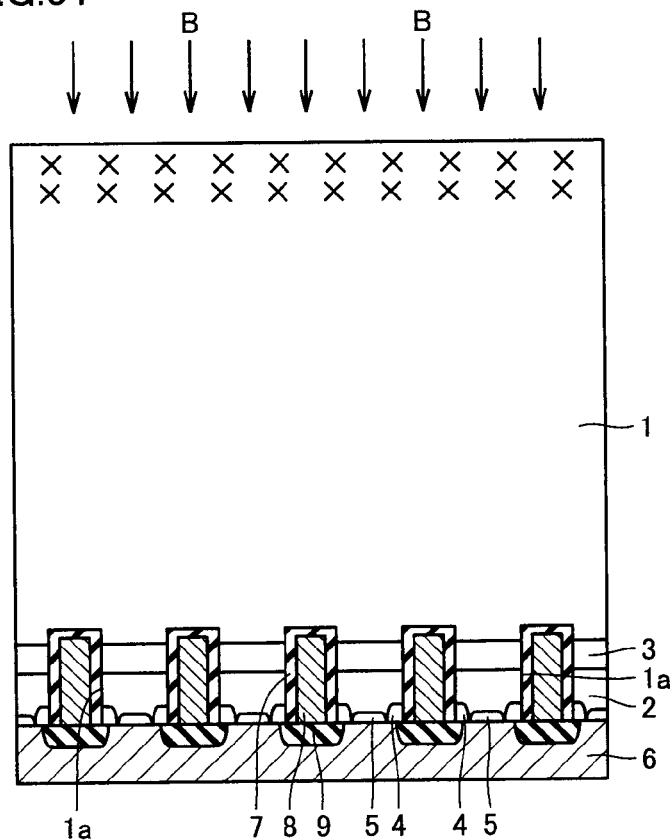

Next, as shown in FIG. 49, interlayer insulating film 9 is formed to cover gate electrode 8 and gate insulating film 7. Next, an electrically conductive emitter electrode layer 6 is formed to cover interlayer insulating film 9. The emitter electrode 6 is connected to emitter region 4 and base region 2. Then, as shown in FIG. 50, to the other main surface of N− substrate 1, phosphorus is injected as n-type impurity with the dose for example of $1\times10^{11}$ cm$^{-2}$ to $1\times10^{15}$ cm$^{-2}$. Then, as shown in FIG. 51, boron is injected as p-type impurity with the dose for example of $1\times10^{12}$ cm$^{-2}$ to $1\times10^{16}$ cm$^{-2}$.

Figure 52:
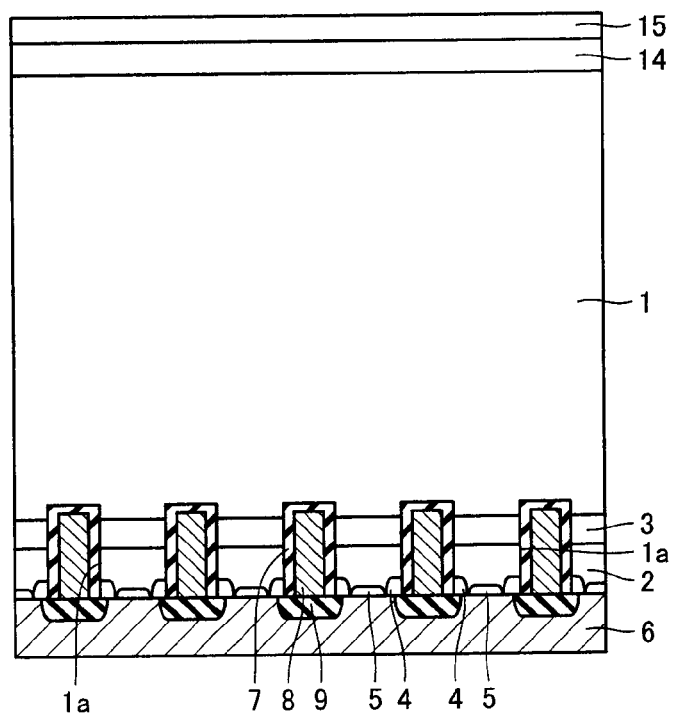
Figure 53:
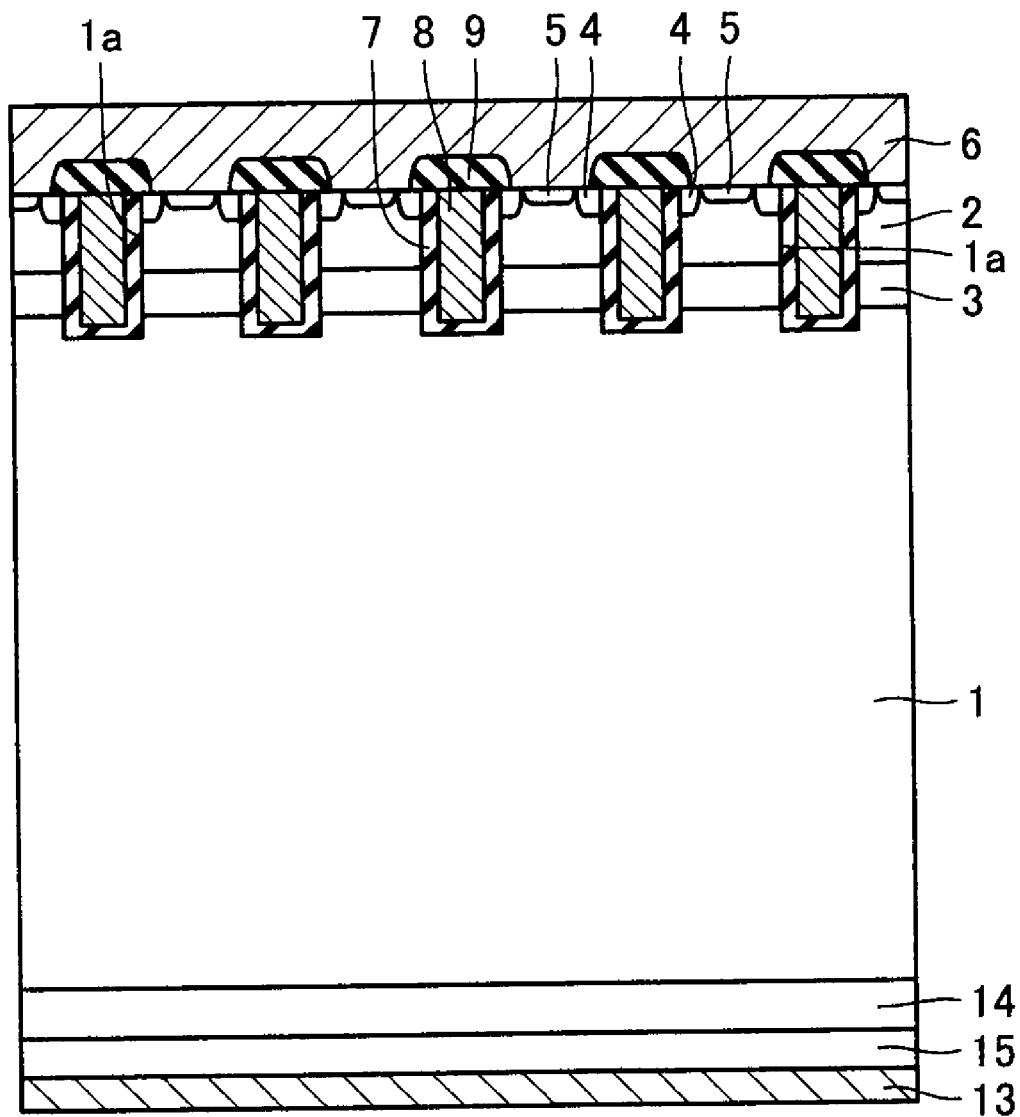

Next, as shown in FIG. 52, heat treatment is performed for example at a temperature of approximately 300° C. to 450° C. for approximately 10 minutes to 3 hours to diffuse the phosphorus and boron injected to N− substrate 1 and thereby form n-type buffer layer 14 and p-type collector layer 15. Then, as shown in FIG. 53, collector electrode 13 connected to collector layer 15 is formed on the surface of collector layer 15. In this way, the light punch-through and carrier storage type IGBT shown in FIG. 23 is formed.

According to the above-described method, the impurities are injected to have the maximum impurity concentration located at the position (depth) corresponding to the position (depth) where the corresponding one of emitter region 4, base region 2 and carrier storage layer 3 is formed. In this way, as described above, regarding emitter region 4, base region 2 and carrier storage layer 3, influences of impurities forming two regions (layer) of the three regions (layer) on the impurity concentration of the remaining one region (layer) are suppressed. As a result, variation of the threshold voltage of the carrier storage type IGBT can be reduced to a considerable degree.

Moreover, the amount of injected impurities can be remarkably reduced as compared with the case where impurities are diffused from the surface to form emitter region 4, base region 2 and carrier storage layer 3. Further, the temperature of heat treatment can be lowered and the time for heat treatment can be shortened. Consequently, the productivity of the carrier storage type IGBT can be improved.

Sixth Embodiment

Figure 54:
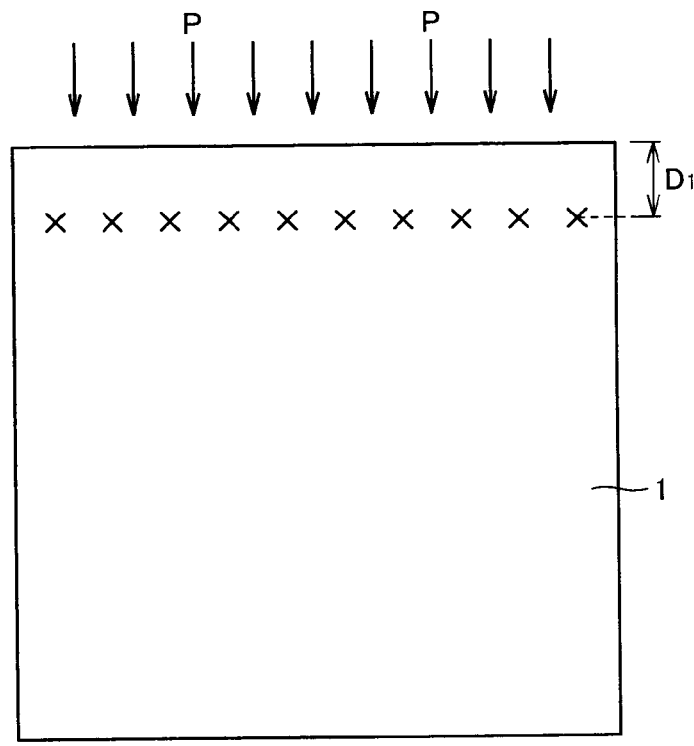
FIG. 54 is a cross-sectional view showing a step of a method of manufacturing a semiconductor device according to a sixth embodiment of the present invention.

Here, a method of manufacturing the carrier storage type IGBT shown in FIG. 25 is described. As shown in FIG. 54, to a main surface of prepared N– substrate 1, phosphorus is selectively injected as n-type impurity under the conditions for example that the dose is $1\times10^{11}$ cm$^{-2}$ to $1\times10^{13}$ cm$^{-2}$ and the acceleration energy is 500 KeV to 4 MeV. Accordingly, phosphorus is injected to have the maximum concentration at predetermined depth $D_1$ corresponding to the position where the carrier storage layer is formed (see FIG. 26).

Figure 55:
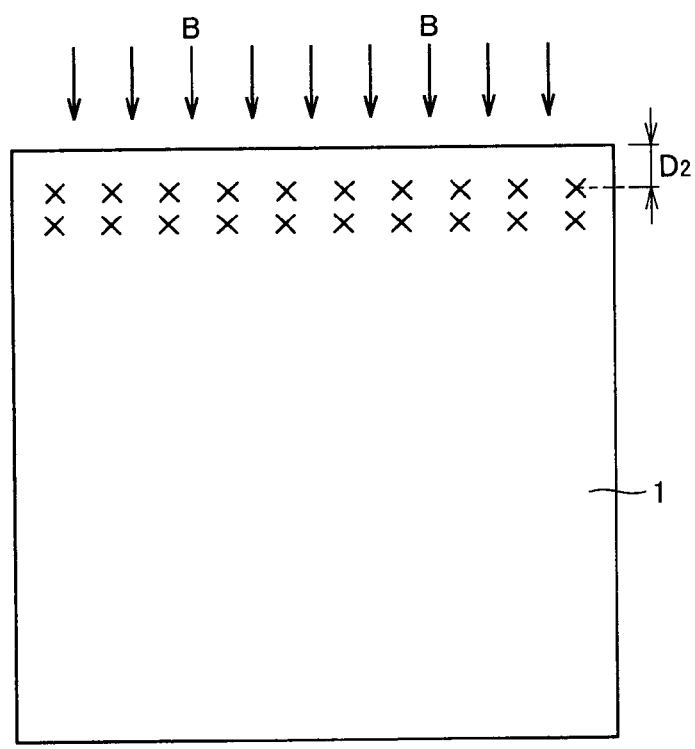
FIGS. 55 to 65 are cross-sectional views showing respective steps performed after respective steps shown in FIGS. 54 to 64.

Then, as shown in FIG. 55, to the main surface of N– substrate 1, boron is selectively injected as p-type impurity under the conditions for example that the dose is $1\times10^{12}$ cm$^{-2}$ to $1\times10^{14}$ cm$^{-2}$ and the acceleration energy is 200 KeV to 2 MeV. Accordingly, the boron is injected to have the maximum concentration at predetermined depth $D_2$ corresponding to the position where the base region is formed (see FIG. 26).

Figure 56:
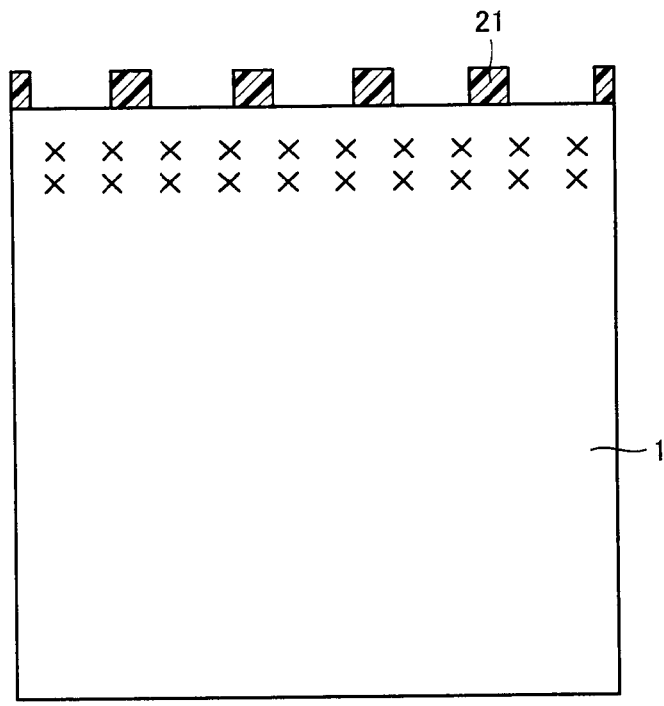
Figure 57:
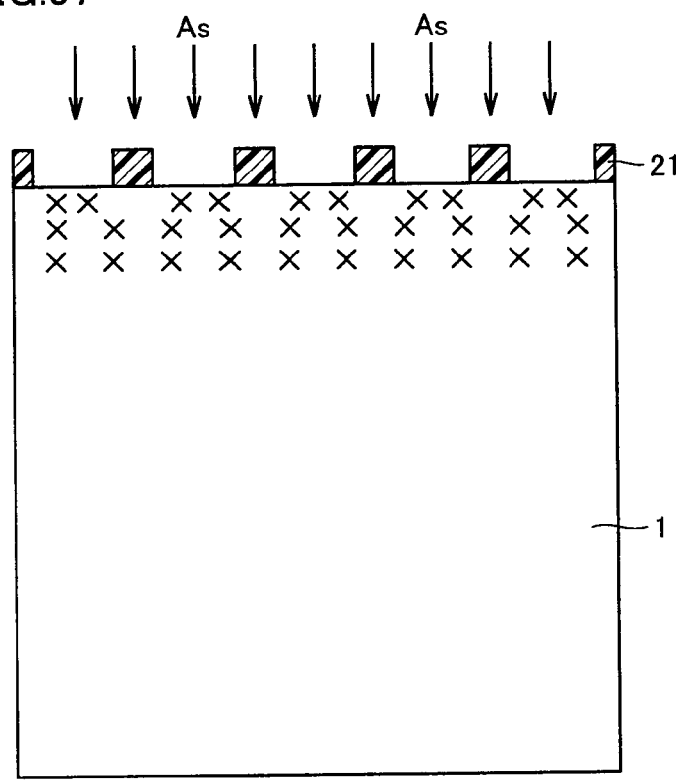

Then, as shown in FIG. 56, predetermined resist pattern 21 for forming the emitter region is formed on the main surface of N– substrate 1. Next, as shown in FIG. 57, arsenic is injected as n-type impurity under the conditions for example that the dose is $1\times10^{13}$ cm$^{-2}$ to $5\times10^{15}$ cm$^{-2}$ and the acceleration energy is 30 KeV to 200 KeV, using resist pattern 21 as a mask. Accordingly, arsenic is injected to have the maximum concentration in or near the surface of N– substrate 1 where the emitter region is formed (see FIG. 26). Resist pattern 21 is thereafter removed.

Figure 58:
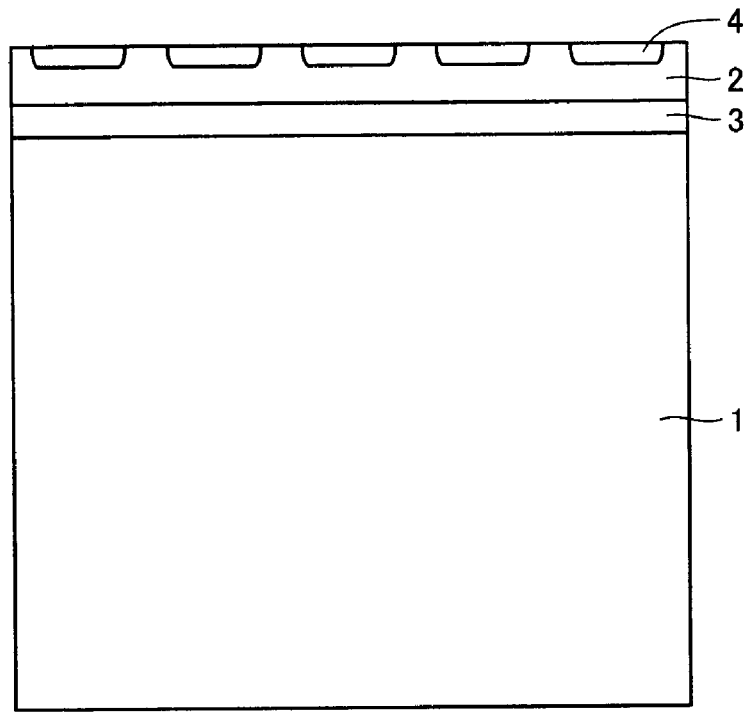

Then, as shown in FIG. 58, heat treatment is performed for example at a temperature of approximately 950° C. to 1150° C. in a nitrogen ($N_2$) ambient or oxygen ($O_2$) ambient for approximately 20 minutes to 2 hours, to diffuse the phosphorus, boron and arsenic injected to N– substrate 1 and thereby form respective regions acting as p-type base region 2, n-type carrier storage layer 3 and n-type emitter region 4. The ambient of the heat treatment may alternatively be an ambient of a mixture of nitrogen ($N_2$) and oxygen ($O_2$) or the ambient of the mixture to which hydrogen ($H_2$) is added.

Figure 59:
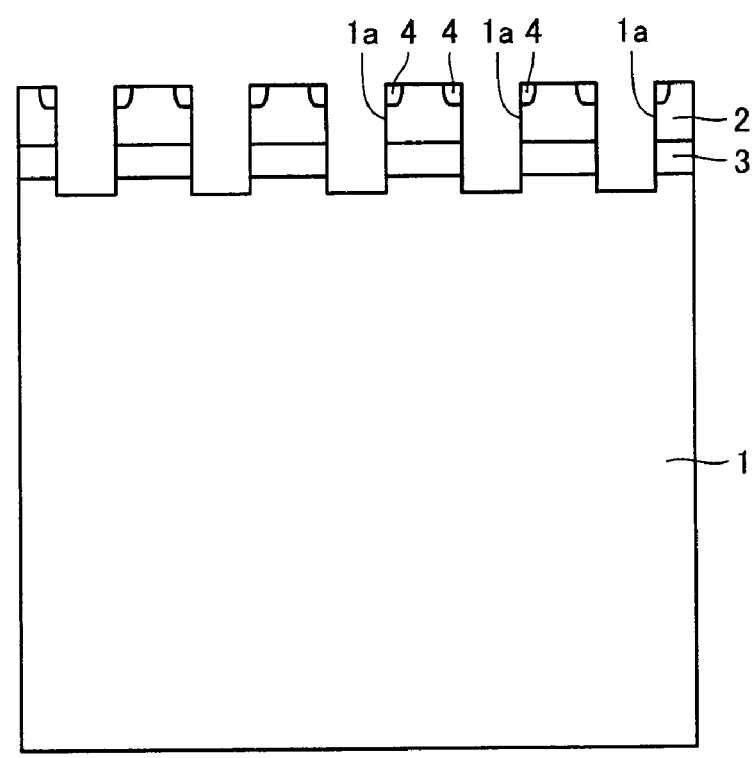
Figure 60:
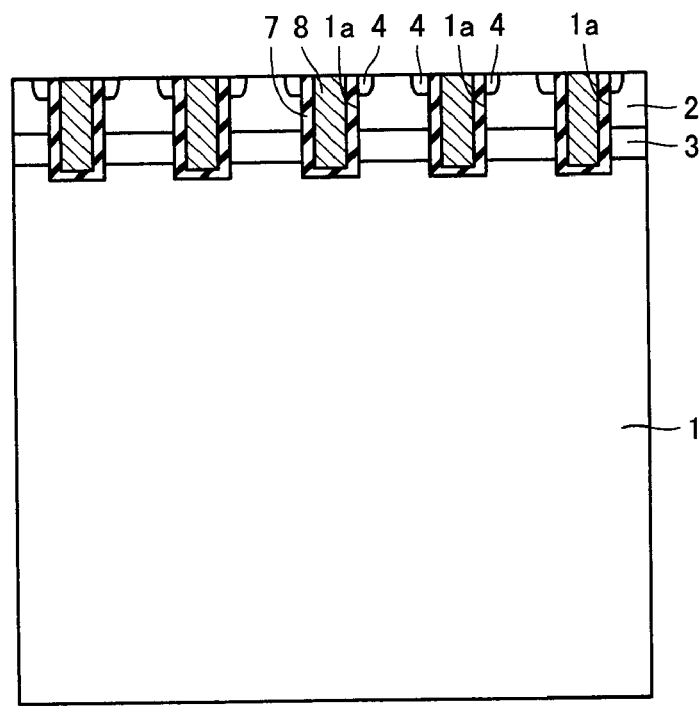

Next, as shown in FIG. 59, opening 1*a* is formed through respective regions that are to act as emitter region 4, base region 2 and carrier storage layer 3 to reach an n-type region of N– substrate 1. Next, an insulating film (not shown) is formed on the main surface of N– substrate 1 (on the surface of base region 2 and emitter region 4) to cover the sidewall surface and the bottom surface of opening 1*a*. Then, a polysilicon film (not shown) is formed on the insulating film to fill the inside of opening 1*a*. Then, the portion of the polysilicon film and the portion of the insulating film located on the main surface of N– substrate 1 are removed to form gate electrode 8 on the sidewall substrate of opening 1*a* with gate insulating film 7 interposed therebetween, as shown in FIG. 60.

Figure 61:
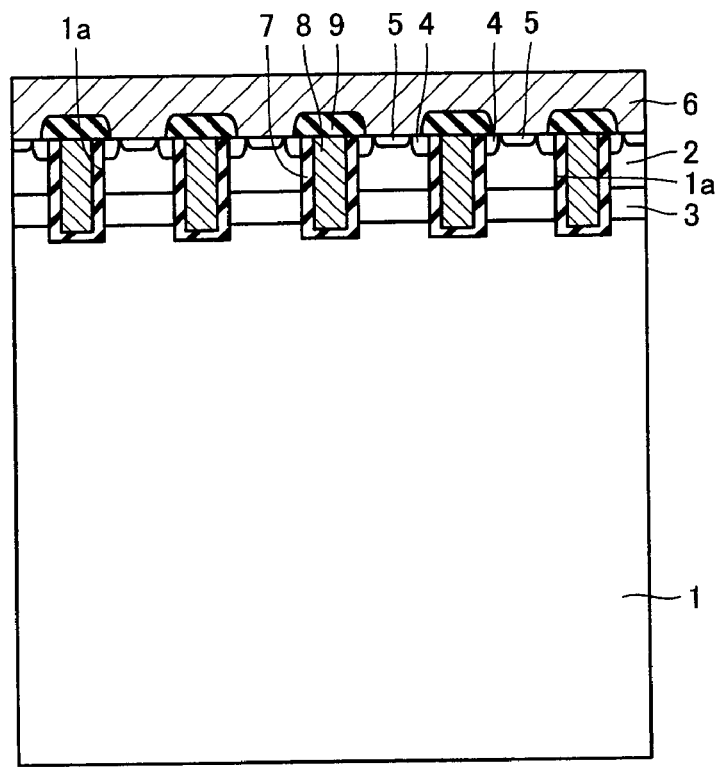

Next, as shown in FIG. 61, interconnection 10 electrically connected to gate electrode 8 is formed. Interlayer insulating film 9 is formed to cover interconnection 10. Next, an electrically conductive layer (not shown) is formed to cover interlayer insulating film 9. The electrically conductive layer undergoes a predetermined process to form emitter electrode 6 connected to collector region 4 and base region 2.

Figure 62:
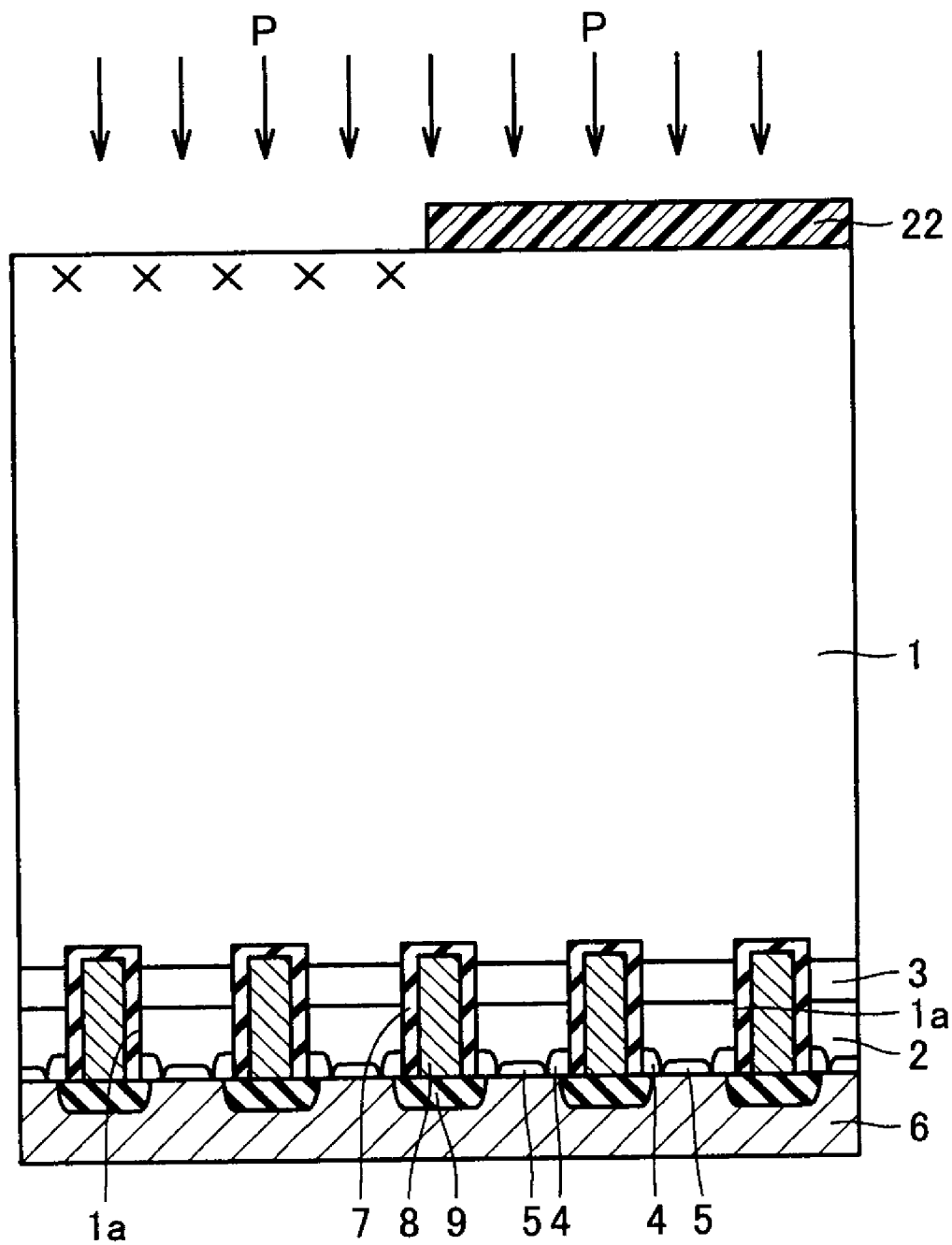
Figure 63:
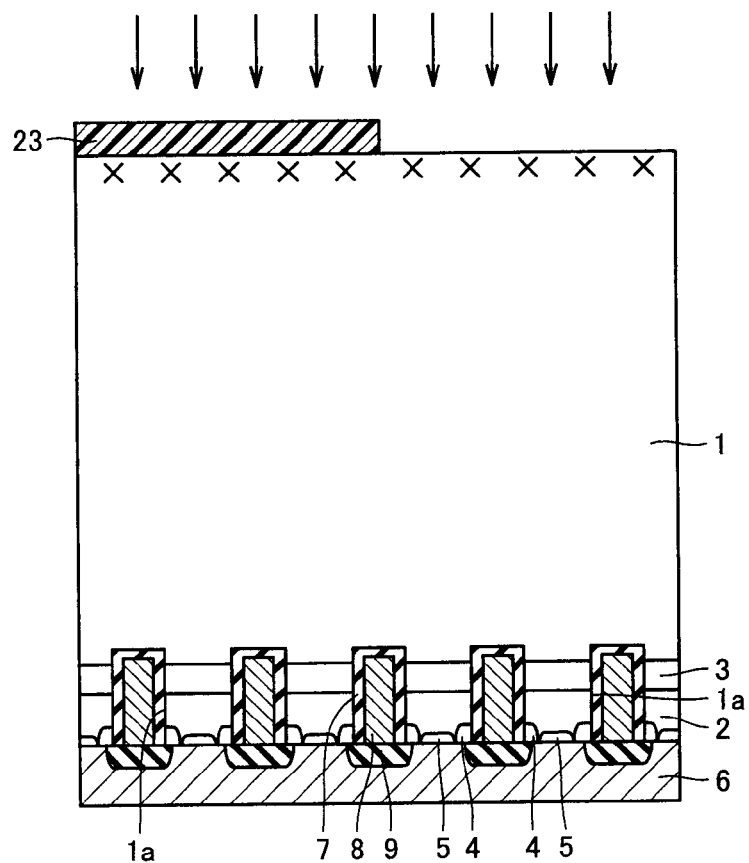

Next, as shown in FIG. 62, a resist pattern 22 is formed for forming an n-type cathode region on the rear surface of N– substrate 1. Then, using resist pattern 22 as a mask, phosphorus is injected as n-type impurity with the dose for example of $1\times10^{11}$ cm$^{-2}$ to $1\times10^{15}$ cm$^{-2}$. After this, resist pattern 22 is removed. Then, as shown in FIG. 63, a resist pattern 23 is formed for forming a p-type collector region on the rear surface of N– substrate 1. Then, using resist pattern 23 as a mask, boron is injected as p-type impurity with the dose for example of $1\times10^{11}$ cm$^{-2}$ to $1\times10^{15}$ cm$^{-2}$. After this, resist pattern 23 is removed.

Figure 64:
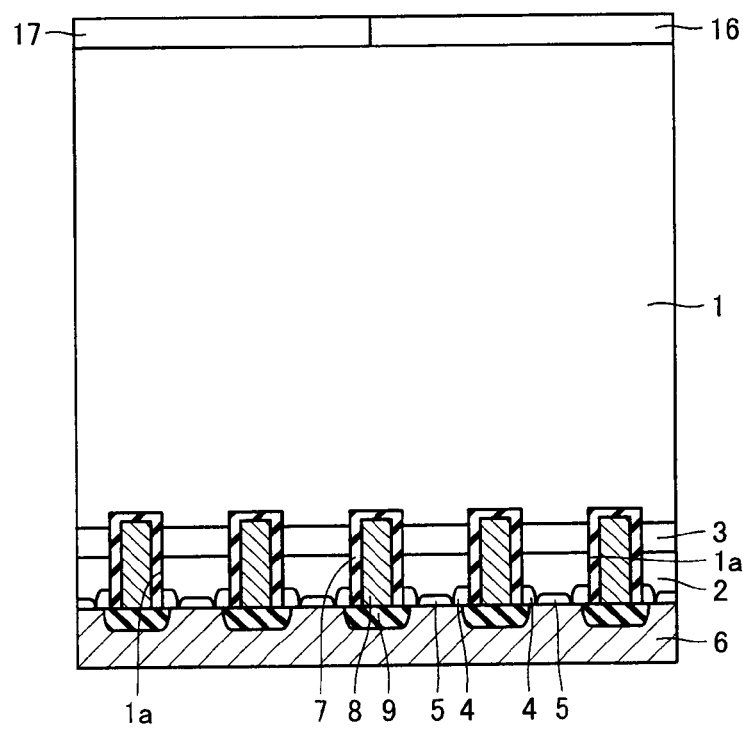
Figure 65:
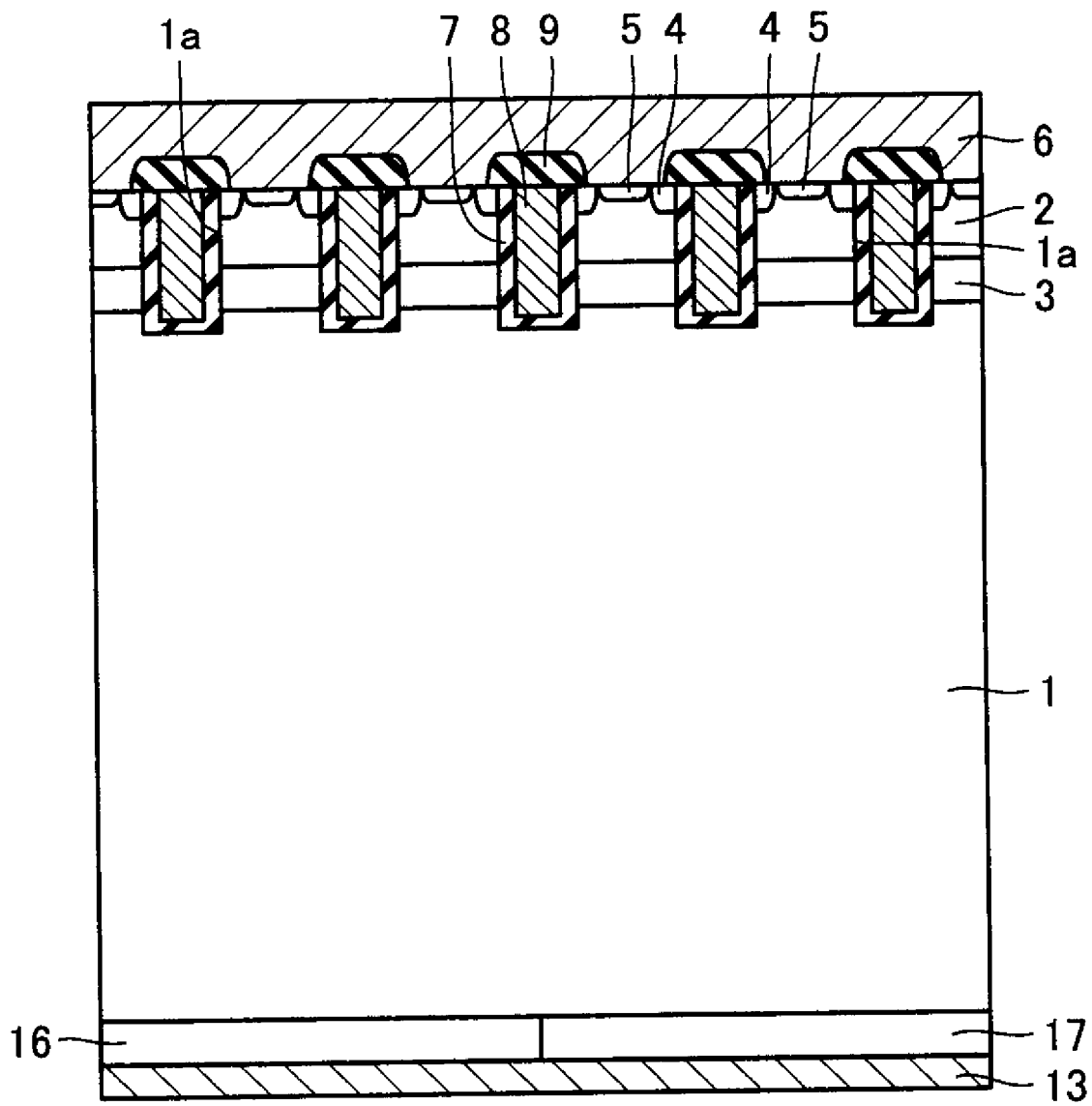

Next, as shown in FIG. 64, heat treatment is performed for example at a temperature of approximately 300° C. to 450° C. for approximately 15 minutes to 3 hours to diffuse the phosphorus and boron injected to N– substrate 1 and thereby form n-type cathode region 17 and p-type collector region 16. Then, as shown in FIG. 65, collector electrode 13 is formed to contact cathode region 17 and collector region 16. In this way, the carrier storage type IGBT as shown in FIG. 25 is formed.

According to the above-described method, the impurity is injected to have the maximum impurity concentration located at the position (depth) corresponding to the position (depth) where the corresponding one of emitter region 4, base region 2 and carrier storage layer 3 is formed. In this way, as described above, regarding emitter region 4, base region 2 and carrier storage layer 3, influences of impurities forming two regions (layer) of the three regions (layer) on the impurity concentration of the remaining one region (layer) are suppressed. As a result, variation of the threshold voltage of the carrier storage type IGBT can be reduced to a considerable degree.

Moreover, the amount of injected impurities can be remarkably reduced as compared with the case where impurities are diffused from the surface to form emitter region 4, base region 2 and carrier storage layer 3. Further, the temperature of heat treatment can be lowered and the time for heat treatment can be shortened. Consequently, the productivity of the carrier storage type IGBT can be improved.

Figure 66:
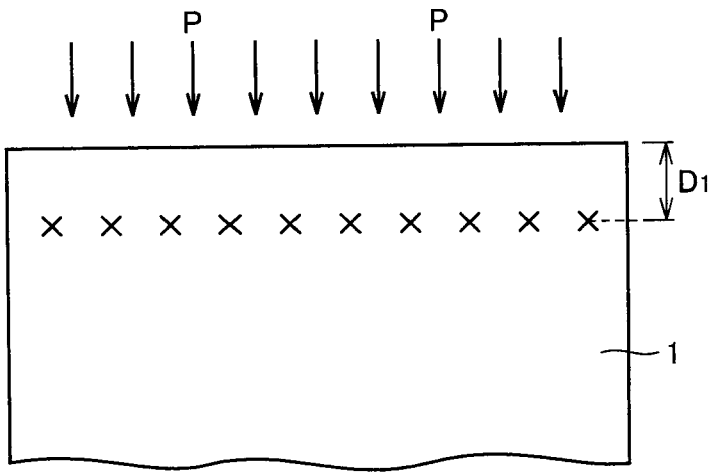
FIG. 66 is a cross-sectional view showing a step of a heat treatment process according to a modification of the fourth to sixth embodiments.
Figure 67:
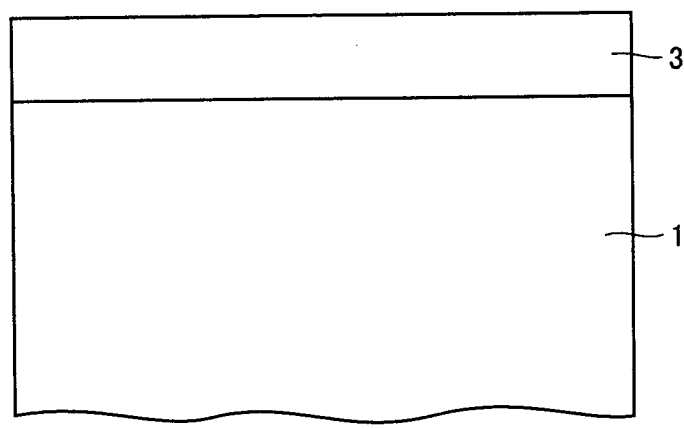
FIGS. 67 to 71 are cross-sectional views showing respective steps performed after respective steps shown in FIGS. 66 to 70.
Figure 68:
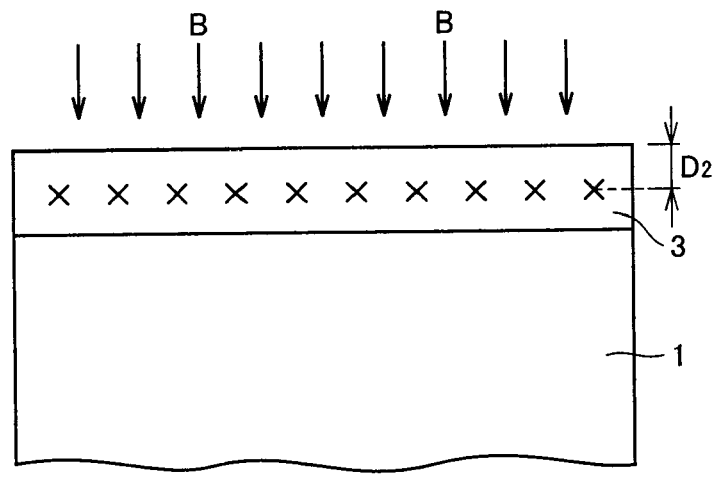
Figure 69:
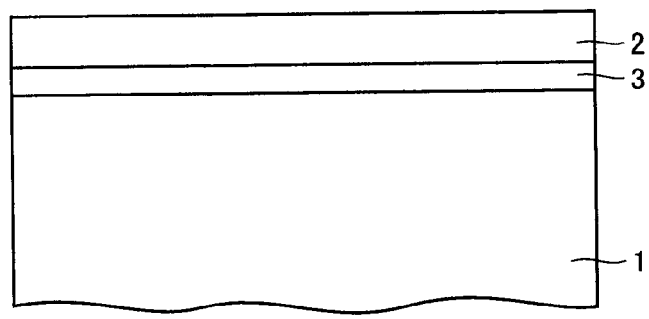
Figure 70:
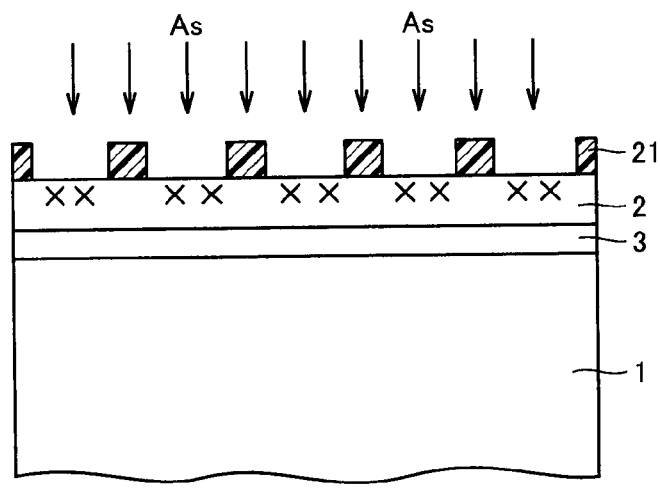
Figure 71:
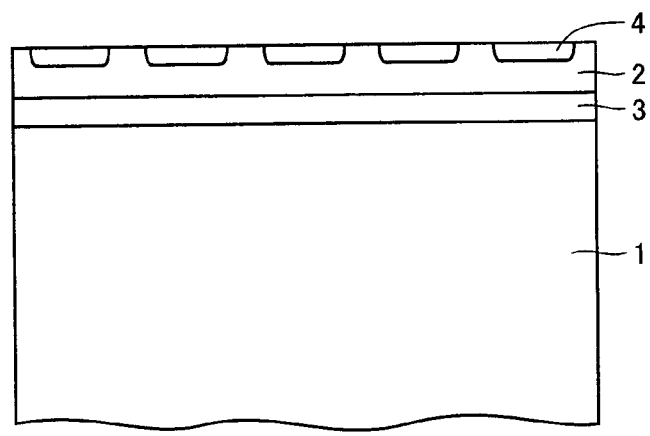

The above-described manufacturing methods are each described in connection with the example where respective impurities are injected for forming emitter region 4, base region 2 and carrier storage layer 3 and thereafter they are collectively subjected to the heat treatment so as to form respective regions (layer). Alternatively, they may be formed for example in the following way. As shown in FIG. 66, phosphorus is injected for forming the carrier storage layer and thereafter heat treatment is performed to form the region that is to act as carrier storage layer 3 as shown in FIG. 67. Then, as shown in FIG. 68, boron is injected for forming the base region and thereafter heat treatment is performed to form the region that is to act as base region 2 as shown in FIG. 69. Then, as shown in FIG. 70, arsenic is injected for forming the emitter region and thereafter heat treatment is performed to form the region that is to act as emitter region 4 as shown in FIG. 71. Thus, the heat treatment may be performed for each process of injecting the impurity.

INDUSTRIAL APPLICABILITY

The semiconductor device according to the present invention is appropriate for inverter drive of industrial equipment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate of a first conductivity type having a first main surface and a second main surface opposite to each other;
   a first impurity region of the first conductivity type formed by a first impurity of the first conductivity type having a maximum impurity concentration at a first depth from said first main surface of said semiconductor substrate, said first impurity region formed in a region corresponding to said first depth and spaced from said first main surface;
   a second impurity region of a second conductivity type formed by a second impurity of the second conductivity type having a maximum impurity concentration at a second depth shallower than said first depth from said first main surface of said semiconductor substrate, said second impurity region formed from a region corresponding to said second depth to reach said first impurity region;
   a third impurity region of the first conductivity type formed by a third impurity of the first conductivity type having a maximum impurity concentration at said first main surface of said semiconductor substrate, said third impurity region formed from said first main surface to a predetermined depth and spaced from said first impurity region with said second impurity region therebetween;
   an opening extending through said third impurity region, said second impurity region and said first impurity region to reach a region of said first conductivity type of said semiconductor substrate;
   an insulating film formed on a sidewall of said opening to cover said third impurity region, said second impurity region and said first impurity region exposed on said sidewall;
   an electrode portion formed in said opening to cover said insulating film; and
   a region of the second conductivity type formed at said second main surface of said semiconductor substrate, wherein
   a combined impurity concentration profile of said first impurity and said second impurity has a first relative maximum value and a second relative maximum value corresponding respectively to respective impurity concentrations of said first impurity and said second impurity,
   said first relative maximum value is located in a concentration profile of said first impurity extending from the maximum impurity concentration of said first impurity to one-tenth of the maximum impurity concentration in a direction of depth from the first main surface to the second main surface, and
   said second relative maximum value is located in a concentration profile of said second impurity extending from the maximum impurity concentration of said second impurity to one-tenth of the maximum impurity concentration in the direction of depth from the first main surface to the second main surface.

2. The semiconductor device according to claim 1, wherein said region of the second conductivity type is a second-conductivity-type substrate, and
   said semiconductor device further comprises a layer of the first conductivity type between said second conductivity-type substrate and said semiconductor substrate of the first conductivity type.

3. The semiconductor device according to claim 1, wherein said region of the second conductivity type is formed to extend from said second main surface of said semiconductor substrate to a predetermined depth, and
   said semiconductor device further comprises, between said region of the second conductivity type and said region of the first conductivity type of said semiconductor substrate, another region of the first conductivity type.

4. The semiconductor device according to claim 1, wherein said region of the second conductivity type is formed in a predetermined region of said second main surface of said semiconductor substrate to extend from said second main surface to a predetermined depth, and
   said semiconductor device further comprises a region of the first conductivity type formed on said second main surface of said semiconductor substrate to extend from said second main surface to said predetermined depth and to be adjacent to said region of the second conductivity type.

5. A method of manufacturing a semiconductor device, comprising:
   preparing a semiconductor substrate of a first conductivity type having a first main surface and a second main surface opposite to each other;
   forming a first impurity region of the first conductivity type from said first main surface to have a maximum impurity concentration at a first depth from said first main surface of said semiconductor substrate, said first impurity region being formed in a region corresponding to said first depth and spaced from said first main surface;
   forming a second impurity region of a second conductivity type from said first main surface to have a maximum impurity concentration at a second depth shallower than said first depth from said first main surface, said second impurity region being formed from a region corresponding to said second depth to reach said first impurity region;
   forming a third impurity region of the first conductivity type from said first main surface to have a maximum impurity concentration at said first main surface, said third impurity region formed from said first main surface to a predetermined depth and spaced from said first impurity region with said second impurity region therebetween;
   forming an opening extending through said third impurity region, said second impurity region and said first impurity region to reach a region of the first conductivity type of said semiconductor substrate;
   forming an insulating film on a sidewall of said opening to cover said third impurity region, said second impurity region and said first impurity region exposed on said sidewall;
   forming an electrode portion in said opening to cover said insulating film;
   forming a region of the second conductivity type at said second main surface of said semiconductor substrate; and
   forming a combined impurity concentration profile of said first impurity and said second impurity having a first relative maximum value and a second relative maximum value corresponding respectively to respective impurity concentrations of said first impurity and said second impurity, wherein said first relative maximum value is located in a concentration profile of said first impurity extending from the maximum impurity concentration of said first impurity to one-tenth of the maximum impurity concentration in a direction of depth from the first main surface to the second main surface, and said second relative maximum value is located in a concentration profile of said second impurity extending from the maximum impurity concentration of said second impurity to one-tenth of the maximum impurity concentration in the direction of depth from the first main surface to the second main surface.

6. The semiconductor device according to claim 1, wherein the first impurity is phosphorus, the second impurity is boron, and the third impurity is arsenic.

7. The method of manufacturing the semiconductor device according to claim 5, wherein said forming said semiconductor substrate includes:

forming a layer of the first conductivity type on a surface of a second conductivity type substrate as a region of said second conductivity type; and forming another layer of the first conductivity type as said semiconductor substrate of the first conductivity type on said layer of the first conductivity type.

8. The method of manufacturing the semiconductor device according to claim 5, wherein said second impurity region of the second conductivity type is formed by injecting a fourth impurity of the second conductivity type to said second main surface of said semiconductor substrate, and said method of manufacturing the semiconductor device further comprises:

forming a region of the first conductivity type to contact said region of the second conductivity type and to be located at a deeper position than said region of the second conductivity type by injecting a fifth impurity of the first conductivity type to said second main surface of said semiconductor substrate.

9. The method of manufacturing the semiconductor device according to claim 5, wherein said second impurity region of the second conductivity type is formed by injecting a fourth impurity of the second conductivity type to said second main surface of said semiconductor substrate, and said method of manufacturing the semiconductor device further comprises the step of:

forming a region of the first conductivity type adjacent to said region of the second conductivity type by injecting a fifth impurity of the first conductivity type to said second main surface of said semiconductor substrate.

* * * * *